(12) United States Patent
Kuo

(10) Patent No.: US 11,792,922 B2
(45) Date of Patent: Oct. 17, 2023

(54) ELECTRONIC CIRCUIT ASSEMBLY AND METHOD FOR MANUFACTURING THEREOF

(71) Applicant: Unimicron Technology Corp., Taoyuan (TW)

(72) Inventor: Chun-Hung Kuo, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 16 days.

(21) Appl. No.: 17/662,432

(22) Filed: May 8, 2022

(65) Prior Publication Data

US 2023/0284376 A1 Sep. 7, 2023

(30) Foreign Application Priority Data

Mar. 3, 2022 (TW) .................................. 111107645

(51) Int. Cl.
| | | |
|---|---|---|
| *H05K 1/02* | (2006.01) | |
| *H05K 1/18* | (2006.01) | |
| *H05K 1/11* | (2006.01) | |
| *H05K 3/40* | (2006.01) | |
| *H05K 3/32* | (2006.01) | |

(52) U.S. Cl.
CPC ........... *H05K 1/0271* (2013.01); *H05K 1/115* (2013.01); *H05K 1/181* (2013.01); *H05K 3/32* (2013.01); *H05K 3/40* (2013.01); *H05K 2201/068* (2013.01); *H05K 2201/10378* (2013.01)

(58) Field of Classification Search
CPC ................. H05K 1/0271; H05K 1/181; H05K 2201/068; H05K 2201/10378
See application file for complete search history.

(56) References Cited

U.S. PATENT DOCUMENTS

| | | | |
|---|---|---|---|
| 2004/0173891 A1* | 9/2004 | Imai ..................... | H05K 3/3436 257/686 |
| 2004/0184219 A1* | 9/2004 | Otsuka .............. | H01L 23/49805 257/E23.079 |
| 2005/0168961 A1* | 8/2005 | Ono .................... | H01L 25/0652 257/E25.011 |
| 2021/0358855 A1 | 11/2021 | Strong et al. | |

FOREIGN PATENT DOCUMENTS

| | | |
|---|---|---|
| TW | M611216 U | 5/2021 |
| TW | 202129880 A | 8/2021 |
| TW | I740219 B | 9/2021 |

* cited by examiner

*Primary Examiner* — Sherman Ng
(74) *Attorney, Agent, or Firm* — CKC & Partners Co., LLC

(57) ABSTRACT

An electronic circuit assembly includes an interposer substrate, a wiring substrate, an electrical connective part and an electronic component. The interposer substrate with a first coefficient of thermal expansion (CTE) includes a first surface, a second surface opposite to the first surface, and a first side surface connecting to the first surface and the second surface. The wiring substrate with a second CTE is disposed below the second surface. The first CTE is lower than the second CTE. The electrical connective part is disposed in the interposer substrate and extends to the first side surface. The electronic component is attached to the first side surface and is electrically connected to the electrical connective part.

19 Claims, 20 Drawing Sheets

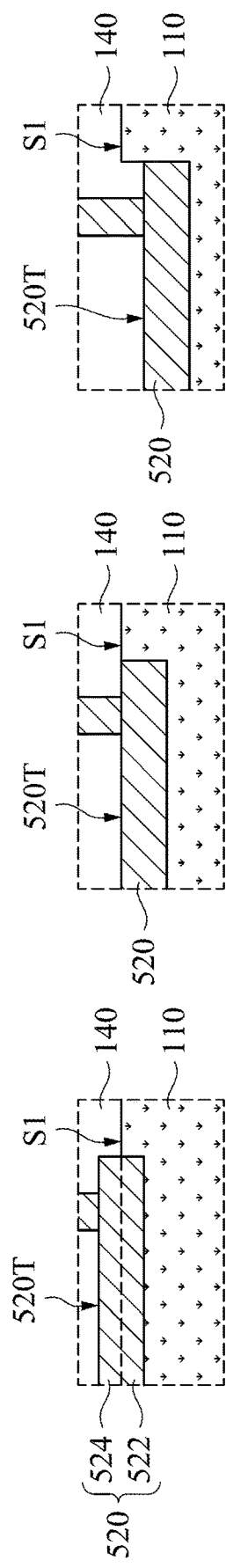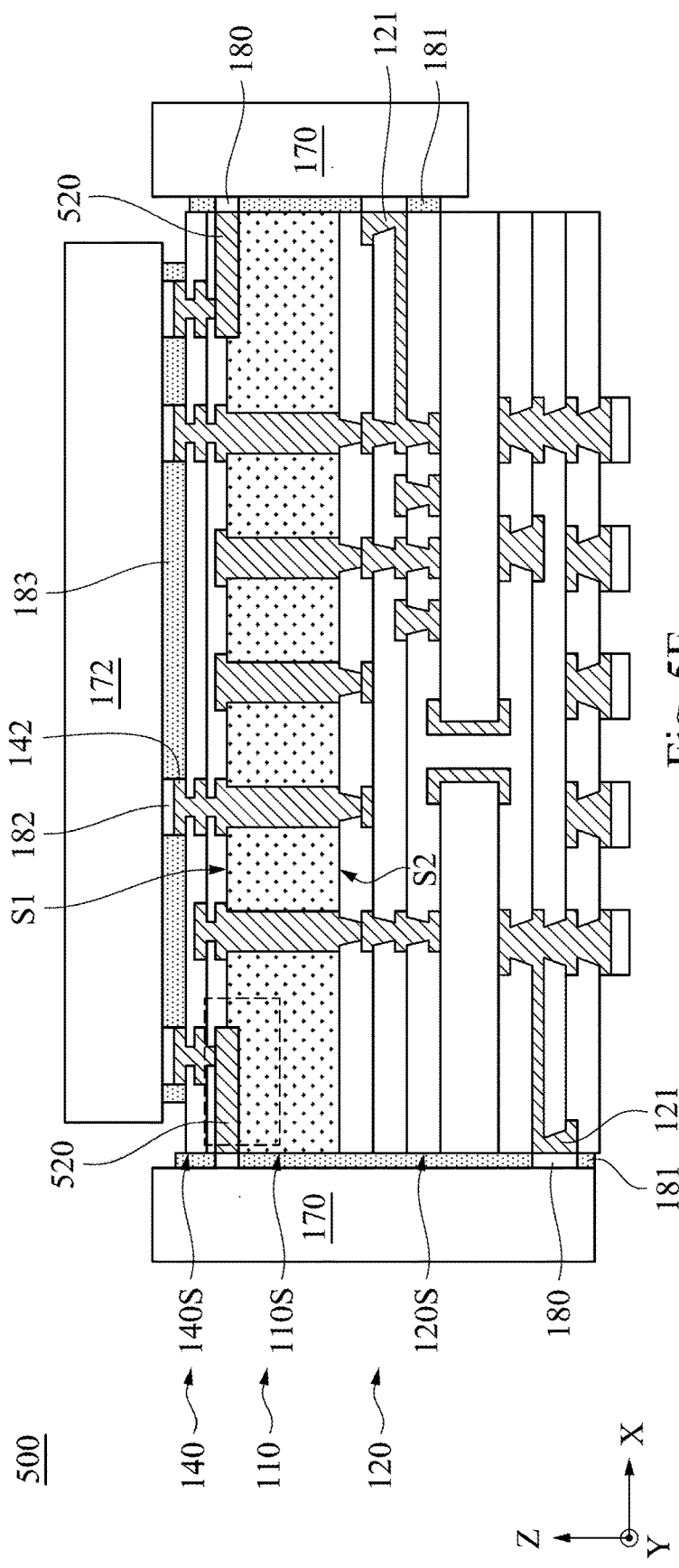

though the substrate with a low coefficient of thermal expansion (CTE)
ELECTRONIC CIRCUIT ASSEMBLY AND METHOD FOR MANUFACTURING THEREOF

CROSS-REFERENCE TO RELATED APPLICATION

This application claims priority to Taiwan Application Serial Number 111107645 filed Mar. 3, 2022, which is herein incorporated by reference in its entirety.

BACKGROUND

Field of Invention

The present disclosure relates to an electronic circuit assembly and a method for manufacturing thereof.

Description of Related Art

The electronic product may include circuit boards and electronic components mounted on the circuit boards. Advances in electronic products have increased the demand for fast speed, high reliability, multiple function, miniature, and high performance. To meet this demand, the communication distance among the electronic components and the footprint of wiring in the circuit board may be designed to be reduced, which can be achieved by mounting the electronic components on the side surface of the circuit board in addition to on the upper/lower surface of the circuit board.

SUMMARY

An aspect of the present disclosure provides an electronic circuit assembly including an interposer substrate, a wiring substrate, an electrical connective part and an electronic component. The interposer substrate with a first coefficient of thermal expansion (CTE) includes a first surface, a second surface opposite to the first surface, and a first side surface connecting to the first surface and the second surface. The wiring substrate with a second CTE is disposed below the second surface. The first CTE is lower than the second CTE. The electrical connective part is disposed in the interposer substrate and extends to the first side surface. The electronic component is attached to the first side surface and is electrically connected to the electrical connective part.

An aspect of the present disclosure provides a method for manufacturing an electronic circuit assembly including providing a first panel with a first coefficient of thermal expansion (CTE), and bonding the first panel and a second panel. The second panel is with a second CTE larger than the first CTE. The method for manufacturing the electronic circuit assembly further includes cutting the first panel and the second panel to respectively form an interposer substrate and a wiring substrate. The interposer substrate has a first surface, a second surface opposite to the first surface, and a first side surface connected to the first surface and the second surface. The method for manufacturing the electronic circuit assembly further includes forming a first electrical connective part in the interposer substrate. The first electrical connective part extends to the first side surface and has a first end surface exposed in the first side surface. The method for manufacturing the electronic circuit assembly further includes mounting a first electronic component on the first side surface and electrically connecting the first electronic component and the first electrical connective part.

The present disclosure discloses various embodiments to provide an electronic circuit assembly and a method for manufacturing thereof. Electronic components are attached to a side surface of a circuit board to form an electronic circuit assembly, thereby reducing the communication distance among the electronic components and the footprint of wiring in the circuit board. In the above-noted arrangement, a substrate with low coefficient of thermal expansion (CTE) is introduced into the electronic circuit assembly, and the electronic components are mounted to the substrate with lower CTE. Thus, the reliability of the electronic circuit assembly can be enhanced.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 5A-FIG. 5E are cross-sectional views at various intermediate stages of manufacturing an electronic circuit assembly according to some other embodiments of the present disclosure.

FIG. 5F, FIG. 5G and FIG. 5H are enlargement views of the electronic circuit assembly shown in FIG. 5E according to some embodiments of the present disclosure.

DETAILED DESCRIPTION

Figure 1A:
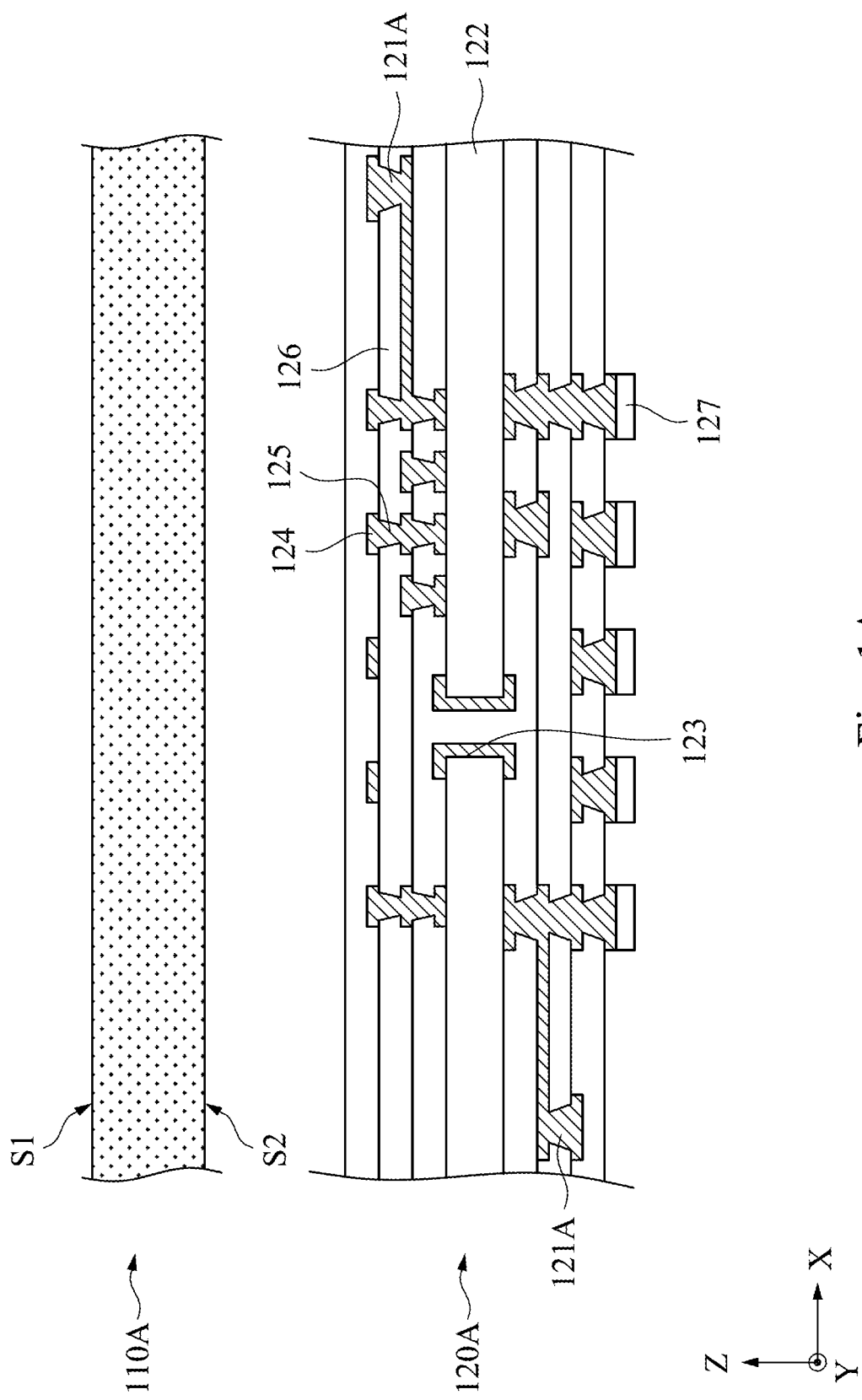
FIG. 1A-FIG. 1G are cross-sectional views at various intermediate stages of manufacturing an electronic circuit assembly according to some embodiments of the present disclosure.

When an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can refer to a percentage of the values as interpreted by those skilled in relevant art(s) in light of the teachings herein. The terms "about" and "substantially" can indicate a value of a given quantity that varies within an acceptable deviation of the value. These values are merely examples and are not intended to be limiting.

Reference will now be made in detail to the present embodiments of the disclosure, examples of which are illustrated in the accompanying drawings. Wherever possible, the same reference numbers are used in the drawings and the description to refer to the same or like parts.

As the electronic industry has been developed rapidly, advances in electronic product have increased the demand for fast speed, high reliability, multiple function, miniature, and high performance. The electronic product may include a circuit board, such as an electronic package carrier and a printed wiring board (PWB), and one or more electronic components mounted on the circuit board. The circuit board has an upper surface, a lower surface and a side surface connected to the upper and lower surfaces. To eliminate the communication distance among the electronic components and the footprint of wiring in the circuit board, a side packaging can be adopted by mounting the electronic components to the side surface of the circuit board in addition to the upper and lower surfaces of the circuit board. Moreover, due to the fact that a substrate with low coefficient of thermal expansion (CTE) may not deform with temperature too much to degrade the reliability, an electronic component can be mounted onto a side surface of the substrate with low CTE, thereby forming an electronic circuit assembly with boosted reliability.

FIG. 1A-FIG. 1G are cross-sectional views at various intermediate stages of manufacturing an electronic circuit assembly 100 according to some embodiments of the present disclosure. Unless otherwise illustrated, the order in which some or all of the operations are described should not be construed to imply that these operations are necessarily order dependent. Alternative ordering will be appreciated having the benefit of this description. Additional operations can be provided before, during, and/or after these operations to completely form the electronic circuit assembly 100, and may be briefly described herein. Further, it will be understood that not all operations are necessarily present in each embodiment provided herein. Also, it will be understood that not all operations are necessary in some embodiments.

Referring to FIG. 1A, FIG. 1A illustrates an operation of providing an interposer substrate 110A and a wiring substrate 120A. The interposer substrate 110A and the wiring substrate 120A can be a panel (or a mother substrate) or a strip to produce multiple circuit boards, that is circuit board units. In some other cases, the interposer substrate 110A and the wiring substrate 120A can be used to produce a single circuit board.

The wiring substrate 120A can include a core substrate 122. In some other embodiments, the wiring substrate 120A can be a coreless substrate, meaning the wiring substrate does not include the core substrate 122. It is noted that the present disclosure presents the wiring substrate 120A including the core substrate 122 as an example but not a limitation. The core substrate 122 can have a plated through hole (PTH) 123. The PTH 123 can be filled with a conductive material as a conductive post, or filled with a non-conductive material of which an insulation layer 126 may be made.

The wiring substrate 120A can be a multi-layer structure including one or more wiring layers 124 disposed on two sides (e.g., along the z axis direction) of the core substrate 122 according to process conditions and product requirements. In some embodiments as shown in FIG. 1A, the wiring substrate 120A can include multiple wiring layers 124, multiple conductive blind holes 125, and multiple insulation layer 126. In some embodiments, the insulation layer 126 may be sandwiched between two adjacent wiring layers 124. In some embodiments, the conductive blind holes 125 may be disposed in the insulation layer 126 and connected to the adjacent wiring layer 124.

The wiring substrate 120A can further include one or more conductive blind holes 121A disposed between wiring layers 124 and embedded in the insulation layer 126. In some embodiments, the conductive blind hole 121A can be disposed in a single insulation layer 126 or extend through two or more insulation layer 126. The conductive blind hole 121A can be functioned as an electrical connective part to be connected to an electronic component in the following process. Thus, a dimension of the conductive blind hole 121A can be adjusted in accordance with process conditions and product requirements.

In some embodiments, the width of the conductive blind hole 121A can be in a range between about 20 micrometers (μm) and about 200 μm. For example, the width of the conductive blind hole 121A can be about 40 μm. If the width of the conductive blind hole 121A is below the above-noted lower limit, the difficulty of operating processes will be increased. If the width of the conductive blind hole 121A is beyond the above-noted upper limit, no obvious advantage is achieved. In addition, the position and the number of the conductive blind hole 121A can also be adjusted in accordance with process conditions and product requirements. For example, as shown in FIG. 1A, two conductive blind holes 121A are separately disposed on two different sides (e.g., along the z axis direction) of the core substrate 122, but the present disclosure is not limited thereto.

The wiring substrate 120A can further include at least one pad 127 connected to the wiring layer 124. The pad 127 can be disposed on the bottommost insulation layer 126 (e.g., one of the insulation layers 126 that is the farthest away from the interposer substrate 110A) or the topmost insulation layer 126 (e.g., one of the insulation layers 126 that is the closest to the interposer substrate 110A) for external connection. In some embodiments as shown in FIG. 1A, the pad 127 is not disposed on the topmost insulation layer 126, and alternatively the topmost insulation layer 126 is made of thermosetting dielectric materials.

The interposer substrate 110A can include a material with lower coefficient of thermal expansion (CTE) and higher rigidity, for example Si substrate, ceramic substrate such as silicon carbide (SiC), other suitable material or a combination thereof. In some embodiments, the CTE of the interposer substrate 110A can be in a range between 1 ppm/° C. and 5 ppm/° C. Further, the material of the interposer substrate 110A is chosen to have a lower CTE than the CTE of wiring substrate 120A. In some embodiments, the CTE of the interposer substrate 110A is lower than the CTE of the wiring substrate 120A by a factor of from about 20 times to about 40 times. In other words, a ratio of the CTE of the interposer substrate 110A to the CTE of the wiring substrate 120A may be between about 0.025 and about 0.050. It is noted that the value of the CTE discussed herein can be referred to as the value of the coefficient of linear thermal expansion (CLTE). In some embodiments where the interposer substrate 110A is made of uniform material(s), the CTEs of the interposer substrate 110A in different directions are comparable, indicating that the CLTEs of the interposer substrate 110A in X, Y and Z axis direction can be similar to each other.

Further, the thickness of the interposer substrate 110A can be in a range between about 0.1 millimeters (mm) and about 12 mm. If the width of the interposer substrate 110A is below the above-noted lower limit, a risk of damaging the interposer substrate 110A in the following processes may be increased. If the width of the interposer substrate 110A is beyond the above-noted upper limit, operating the interposer substrate 110A may become challenging. In some embodiments, the width of the interposer substrate 110A can be in a range between about 0.2 mm and about 0.7 mm.

The materials of the core substrate 122 in the wiring substrate 120A may include polymeric or non-polymeric dielectric materials such as, but not limited to, liquid crystal polymer (LCP), bismaleimide-triazine (BT), prepreg (PP), Ajinomoto build-up film (ABF), epoxy, polyimide (PI), or other suitable dielectric materials. The aforementioned dielectric materials can be reinforced with fibers, such as glass fibers or Kevlar fibers, to strengthen the core substrate 122.

In the wiring substrate 120A, the material of the insulation layer 126 disposed on the two sides (e.g., along the z axis direction) of the core substrate 122 can include polymeric or non-polymeric dielectric materials such as, but not limited to, LCP, BT, PP, ABF, epoxy, PI, other suitable dielectric materials, or combinations thereof. In some embodiments, the topmost insulation layer 126 is made of thermosetting dielectric materials, such as ABF.

Figure 1B:
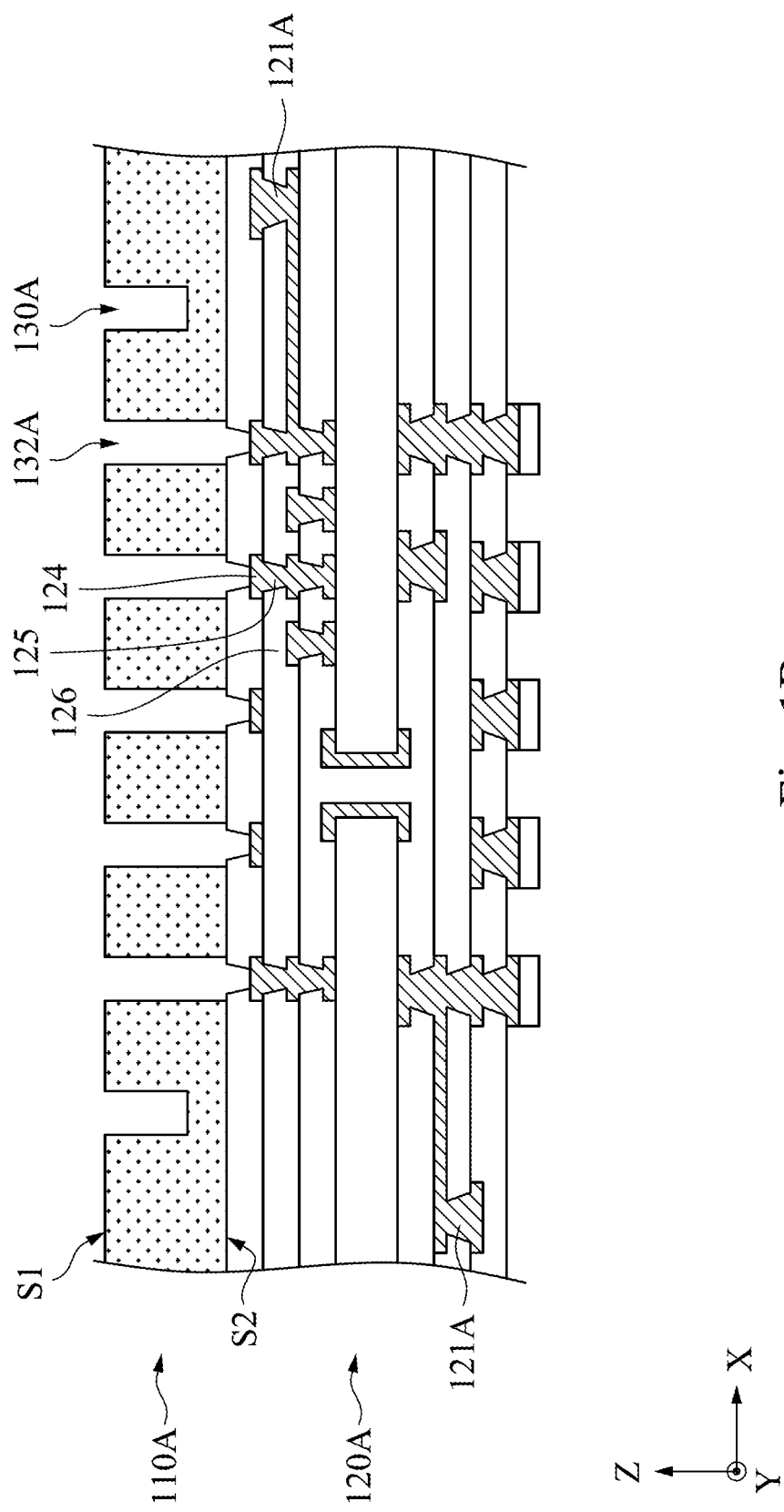

Referring to FIG. 1B, FIG. 1B illustrates an operation of bonding the interposer substrate 110A and the wiring substrate 120A. The interposer substrate 110A and the wiring substrate 120A may be bonded at a particular temperature and pressure according to various materials and process conditions. After bonding, a first surface S1 of the interposer substrate 110A is exposed (i.e., first surface S1 does not contact the wiring substrate 120A), and a second surface S2 of the interposer substrate 110A contacts the wiring substrate 120A. In some embodiments where no pad is disposed on the topmost layer of the wiring substrate 120A, and the topmost layer of the wiring substrate 120A is made of thermosetting dielectric materials, the interposer substrate 110 can directly contact the topmost layer of wiring substrate 120A, thereby scaling down the dimension of the electronic circuit assembly 100.

In such embodiment, a method for bonding the interposer substrate 110A and the wiring substrate 120A can include placing the interposer substrate 110A on the topmost layer of the wiring substrate 120 to make both of them physically contact each other, and subsequently performing a thermal curing process to bond the interposer substrate 110A and the wiring substrate 120A. In some embodiments, after bonding, a polishing process (e.g., a thinning process) can be performed on the interposer substrate 110A to reduce the width of the interposer substrate 110A, thereby scaling down the dimension of the electronic circuit assembly 100.

After bonding the interposer substrate 110A and the wiring substrate 120A, a blind hole 130A and a through hole 132A can be formed in the interposer substrate 110A. A formation method of the blind hole 130A or the through hole 132A can include a laser drill, a deep reactive ion etching (DRIE), other suitable techniques, or a combination thereof.

The blind hole 130A may not penetrate through the interposer substrate 110A and the bottom of the blind hole 130A can be positioned anywhere in the interposer substrate 110A depending on process conditions and product requirements. Particularly, the blind hole 130A may extend from the first surface S1 toward but not reach the second surface S2. The through hole 132A may penetrate through the interposer substrate 110A. In some embodiments where the second surface S2 of the interposer substrate 110A directly contact the topmost layer of the wiring substrate 120A (i.e., no pad or no solder ball between the interposer substrate 110A and the wiring substrate 120A), the through hole 132A may extend from the first surface S1 to the topmost layer of the wiring substrate 120A. In some further embodiments, the through hole 132A may extend to the wiring layer 124 in the wiring substrate 120A. In other words, a portion of wiring layer 124 can be exposed in the through hole 132A. The through hole 132A can be regarded as a through silicon via (TSV) when the interposer substrate 110A includes Si substrate.

Figure 1C:
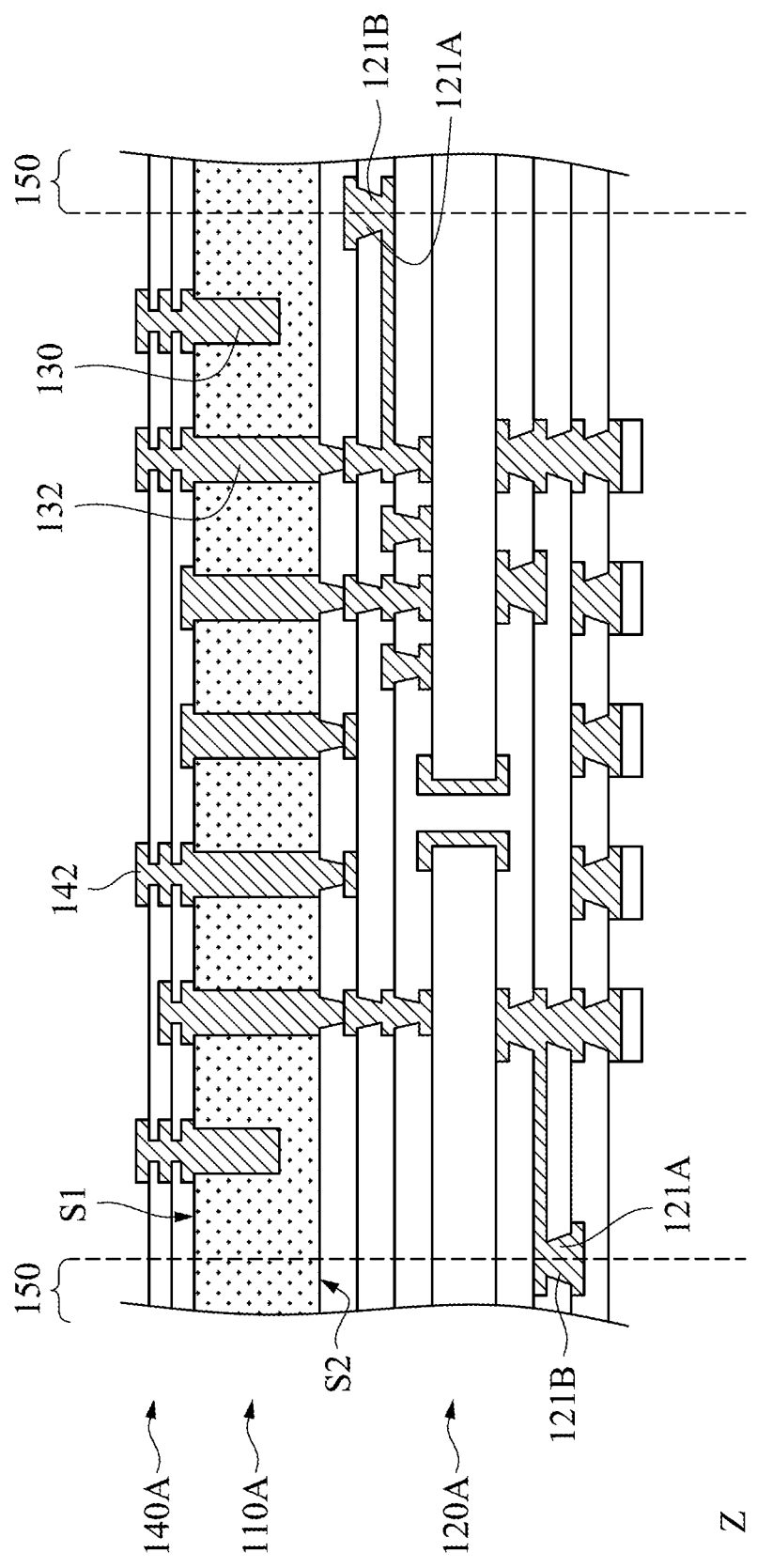

Referring to FIG. 1C, FIG. 1C illustrates an operation of forming a conductive blind hole 130 and a conductive blind hole 132 in the interposer substrate 110A. A method for forming the conductive blind hole 130 and the conductive blind hole 132 in the interposer substrate 110A can include disposing a conductive material (not shown herein) in the blind hole 130A and the through hole 132A (referring to FIG. 1B). The conductive blind hole 132 can be entirely filled with the conductive material as a conductive post, or subsequently filled with a non-conductive material such as solder mask material. In some embodiment as shown in FIG. 1C, the through hole 132A (referring to FIG. 1B) is filled with a conductive material to form the conductive blind hole 132. The profile of the conductive blind hole 130 may be equivalent to the profile of the blind hole 130A (referring to FIG. 1B), and the profile of the conductive blind hole 132 may be equivalent to the through hole 132A (referring to FIG. 1B).

FIG. 1C also illustrates an operation of forming a build-up layer structure 140A on the first surface S1 of the interposer substrate 110A. The number of layers in the build-up layer structure 140A can be adjusted according to process conditions and product requirements. The build-up layer structure 140A may include a wiring layer (no reference number labeled), a conductive blind hole (no reference number labeled), an insulation layer (no reference number labeled) and a pad 142. In some embodiments, the wiring layer (no reference number labeled) in the build-up layer structure 140A can include a redistribution layer (RDL).

The insulation layer (no reference number labeled) in the build-up layer structure 140A may include polymeric or non-polymeric dielectric materials such as, but not limited to, LCP, BT, prepreg, ABF, epoxy, PI, other suitable dielectric materials or a combination thereof. In some embodiments, the insulation layer (no reference number labeled) in the build-up layer structure 140A can be made of photoimageable dielectric materials or photoactive dielectric materials.

In some embodiments shown in FIG. 1C, a portion of the interposer substrate 110A, a portion of the wiring substrate 120A and a portion of the build-up layer structure 140A are positioned within a saw area 150. In some embodiments, a portion 121B of the conductive blind hole 121A in the wiring substrate 120A can be positioned within the saw area 150. It is noted that the conductive blind hole 130 is not disposed within the saw area 150.

Figure 1D:
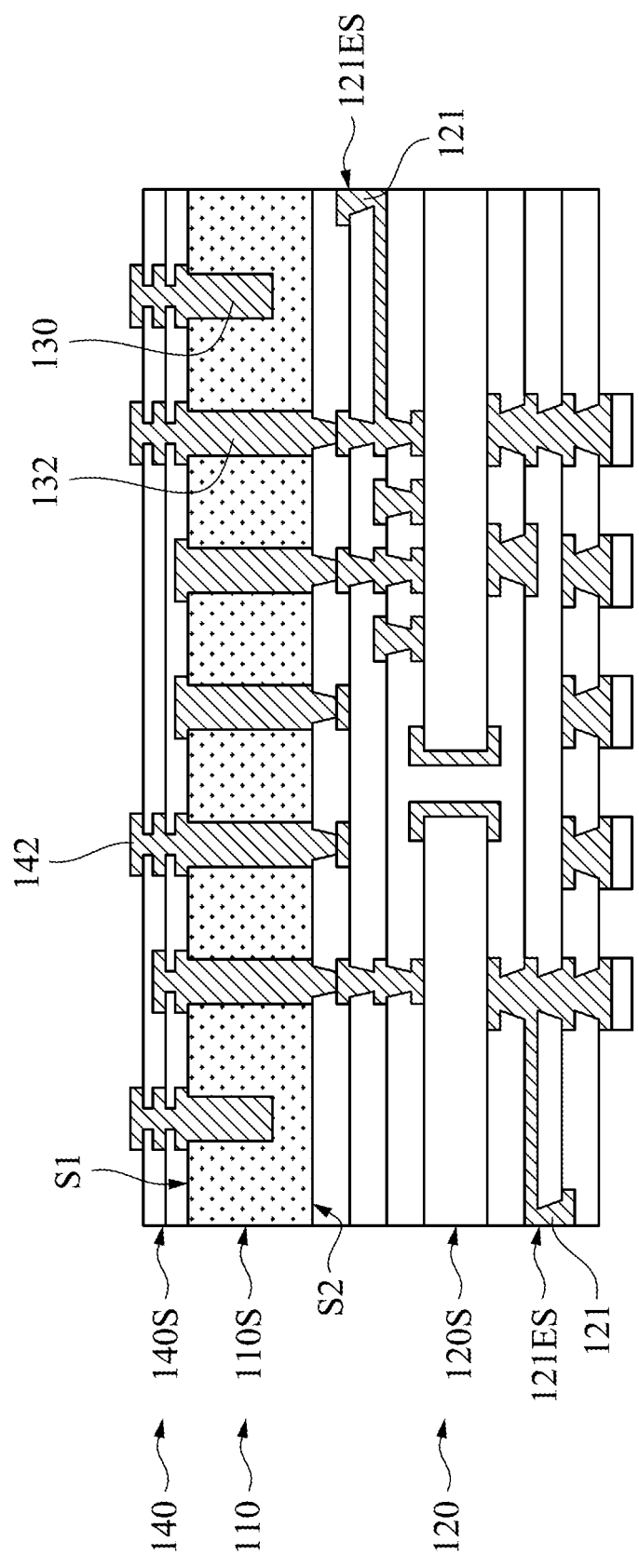

Referring to FIG. 1D, FIG. 1D illustrates an operation of cutting (e.g., dicing) the interposer substrate 110A and the wiring substrate 120A along the saw area 150 such that the interposer substrate 110A and the wiring substrate 120A respectively form one interposer substrate 110 and one wiring substrate 120. In an embodiment where the build-up layer structure 140A is disposed on the interposer substrate 110A, the build-up layer structure 140A is cut to form one build-up layer structure 140.

After cutting (e.g., dicing), the interposer substrate 110 can still have the first surface S1, the second surface S2 opposite to the first surface S1, and the side surface 110S connected to the first surface S1 and the second surface S2. The wiring substrate 120 can have a side surface 120S. In some embodiments, the side surface 120S can be flush with the side surface 110S. In some other embodiments, the build-up layer structure 140 can have a side surface 140S which is flush with the side surface 110S.

During a process of cutting, the portion 121B (referring to FIG. 1C) of the conductive blind hole 121A positioned within the saw area 150 may be removed, and therefore an electrical connective part 121 can be formed. The cut conductive blind hole 121A (i.e., the electrical connective part 121) may be exposed in the side surface 120S of the wiring substrate 120. Particularly, the electrical connective part 121 may have an end surface 121ES exposed in the side surface 120S. With the end surface 121ES exposed in the side surface 120S, the electrical connective part 121 can be connected to an electronic component (not shown herein) in the later manufacturing stage. In other words, after cutting (e.g., dicing), the electrical connective part 121 can be formed in the wiring substrate 120 and extend to the side surface 120S of the wiring substrate 120. The end surface 121ES of the electrical connective part 121 can be exposed in the side surface 120S.

Since the electrical connective part 121 is formed by partially removing the conductive blind hole 121A (referring to FIG. 1C), the original width of the conductive blind hole 121A can be designed to be in a range between about 20 μm and about 200 μm to facilitate a formation of the electrical connective part 121. As described previously, if the original width of the conductive blind hole 121A (referring to FIG. 1C) is below the above-noted lower limit, the difficulty of operating processes will be increased. For example, the accuracy of cutting will be increased. If the original width of the conductive blind hole 121A (referring to FIG. 1C) is beyond the above-noted upper limit, no obvious advantage is achieved. For example, although cutting can be easier with the wider conductive blind hole 121A yet the available area in the wiring substrate 120 may be decreased due to occupation of the wider conductive blind hole 121A.

Figure 1E:
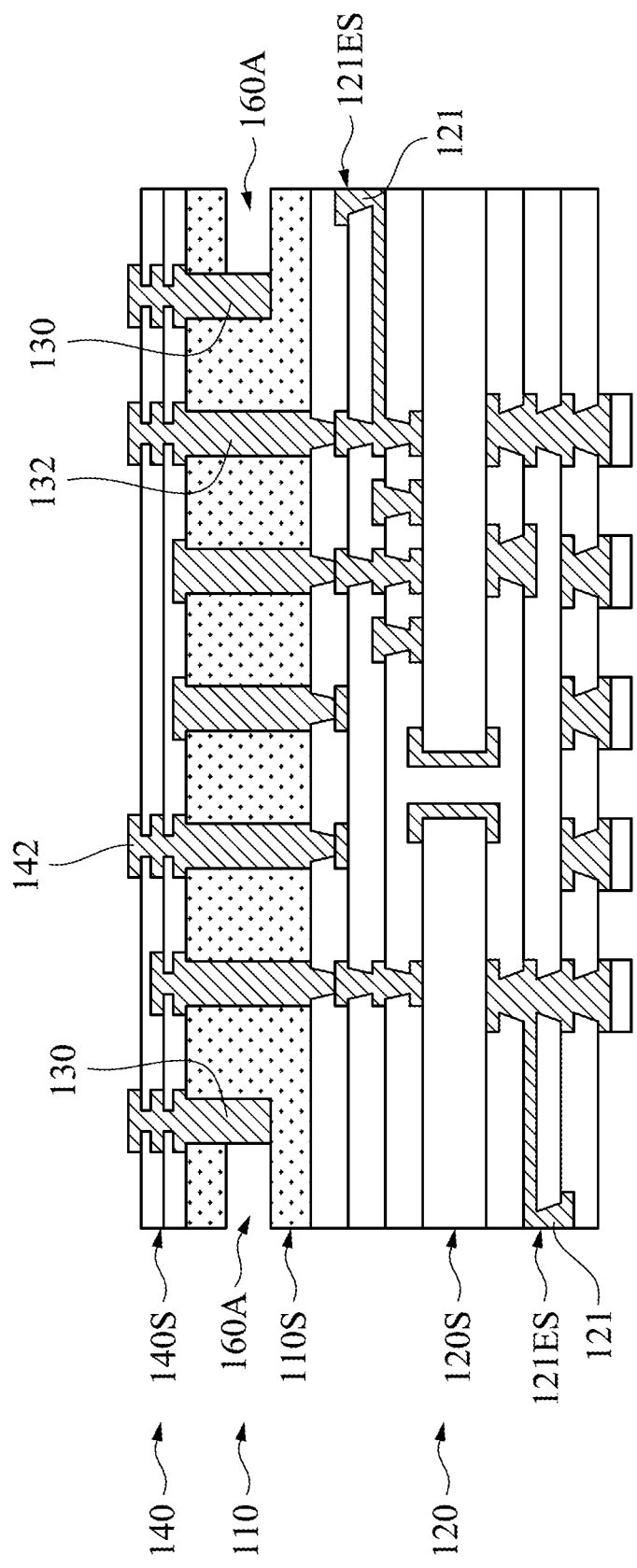

Referring to FIG. 1E, FIG. 1E illustrates an operation of forming an opening 160A in the side surface 110S of the interposer substrate 110 after the process of cutting. Particularly, the opening 160A extends from the side surface 110S to the conductive blind hole 130. That is, the opening 160A is disposed in the interposer substrate 110 and a portion of the conductive blind hole 130 can be exposed in the opening 160A.

Figure 1F:
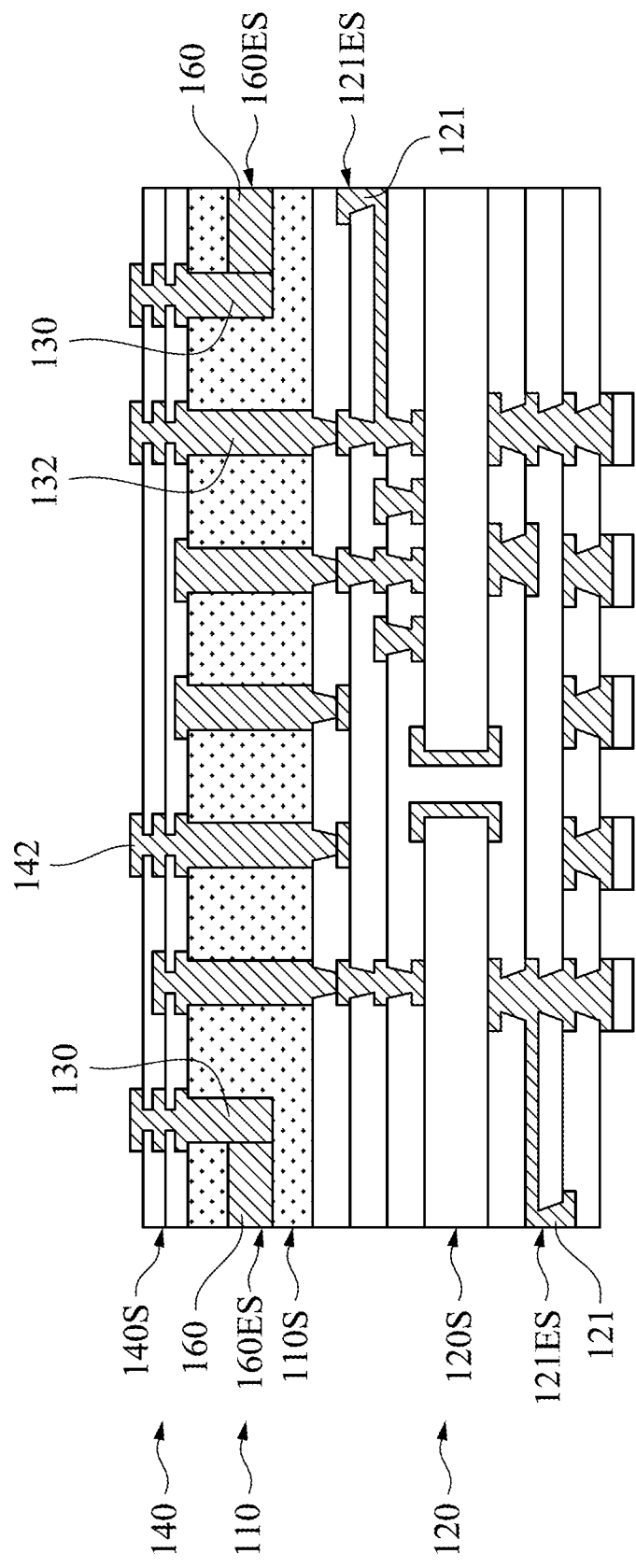

Referring to FIG. 1F, FIG. 1F illustrates an operation of filling the opening 160A (referring to FIG. 1E) with a conductive material to form an electrical connective part 160. The profile of the electrical connective part 160 can be determined by the opening 160A. Therefore, the profile of the electrical connective part 160 may correspond to the profile of the opening 160A as described previously. For example, the electrical connective part 160 can be positioned in the interposer substrate 110 and extend to the side surface 110S. Consequently, the electrical connective part 160 can have an end surface 160ES exposed in the side surface 110S of the interposer substrate 110. The electrical connective part 160 can be electrically connected to the conductive blind hole 130. In some embodiments, the electrical connective part 160 is electrically connected to the conductive blind hole 130 by a direct contact between the electrical connective part 160 and the conductive blind hole 130.

In some embodiments, the interposer substrate 110 entirely wraps the electrical connective part 160 without covering the end surface 160ES. In other words, expect for the end surface 160ES, the rest of the electrical connective part 160 may be embedded in the interposer substrate 110. In some embodiments, with the exposed end surface 160ES in the side surface 110S, the electrical connective part 160 can be connected to an electronic component (not shown herein) in the later manufacturing stage. The end surface 160ES can be flush with the end surface 121ES of the electrical connective part 121, thereby helping the electrical connective part 160 and the electrical connective part 121 to be connected to the same electronic component (not shown herein).

In some embodiments, the end surface 160ES is exposed in the side surface 110S and flush with the side surface 110S. In some other embodiments, the end surface 160ES is exposed in the side surface 110S and is not flush with the side surface 110S. For instance, the end surface 160ES can protrude from the side surface 110S.

The processes illustrated in FIG. 1E and FIG. 1F are performed on the side surface 110S of the interposer substrate 110, meaning a lateral process (e.g., parallel to YZ plane or XZ plane) are performed on the interposer substrate 110. For example, a method for operating the lateral process may include disposing a protection layer on surfaces (e.g., parallel to XY plane) which are not treated, exposing the side surface 110S, forming the opening 160A in the side surface 110S, forming a seed layer in the opening 160A and the side surface 110S, performing an electroplating process to fill the opening 160A with a conductive material and to form the conductive material on the side surface 110S, performing a polishing process (e.g., chemical mechanical polishing, CMP) on the side surface 110S, and removing the protection layer. The polishing process may remove extra conductive material on the side surface 110S to make the end surface 160ES and the side surface 110S coplanar.

In some embodiments, after polishing, a dry etching process or a wet etching process may be performed on the side surface 110S to make the end surface 160ES protrude from the side surface 110S. For example, fluorine-containing gas, such as Sulfur(IV) fluoride (SF4), carbon tetrafluoride (CF4) and any other suitable gas mixing therewith, can be applied in the dry etching process to etch a portion of the interposer substrate 110. An etchant solution applied in the wet etching process can include any suitable chemicals which are capable of removing desmear. In some embodiments, a fluorine-containing solution such as hydrofluoric acid can be used in the wet etching process.

Figure 1G:
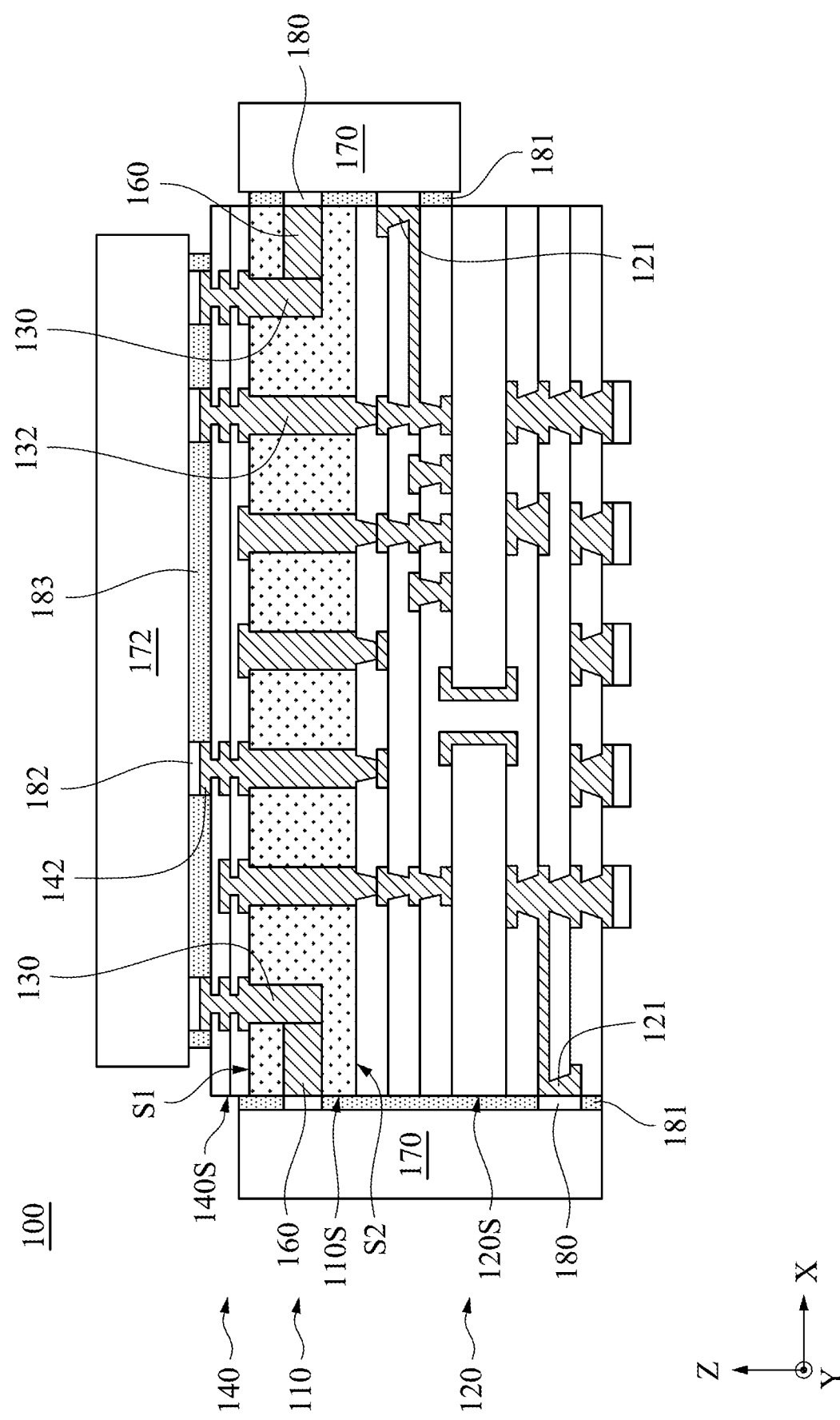

Referring to FIG. 1G, FIG. 1G illustrates an operation of mounting an electronic component 170 on the side surface 110S of the interposer substrate 110 and the side surface 120S of the wiring substrate 120, electrically connecting the electronic component 170 and the electrical connective part 160, and electrically connecting the electronic component 170 and the electrical connective part 121. In other words, the electronic component 170 can be electrically connected to the electrical connective part 160 and the electrical connective part 121 at the same time. Therefore, the electronic component 170 may include at least two external contacts (not shown herein) to be connected to the electrical connective part 160 and the electrical connective part 121 simultaneously, as shown in FIG. 1G. Then, the electronic circuit assembly 100 including the electronic component 170, the interposer substrate 110 and the wiring substrate 120 can substantially be complete.

As discussed previously, the material of the interposer substrate 110 is chosen to have a lower CTE, for example in range between 1 ppm/° C. and 5 ppm/° C. When the electronic component 170 is mounted on the side surface 110S of the interposer substrate 110, since the interposer substrate 110 with low CTE may not deform with temperature too much to cause detachment of the electronic component 170, the interposer substrate 110 can allow the reliability of side packaging enhanced.

The embodiments described in the present disclosure disclose that the electronic component 170 can be mounted on the side surface 110S of the interposer substrate 110 and the side surface 120S of the wiring substrate 120 to effectively utilize a side space (e.g., parallel to parallel to YZ plane or XZ plane). Therefore, the footprint of wiring (e.g., parallel to XY plane) can be reduced, thereby scaling down the dimension of the electronic circuit assembly 100.

The electronic component 170 can be a passive component, for example a capacitor, an inductor, a resistor and the like. Alternatively, the electronic component 170 can be an active component, for example a transistor. Alternatively, the electronic component 170 can include a passive component and an active component, such as an integrated circuit (IC) with the passive component and the active component, but the present disclosure is not limited thereto.

In some embodiments, a metal layer 180 can be disposed between the electronic component 170 and the electrical connective part 160, or between the electronic component 170 and electrical connective part 121, as shown in FIG. 1G. The metal layer 180 can provide the function of solder to bond the electronic component 170 to the side surface 110S or the side surface 120S. In some embodiments, the material of the metal layer 180 can include aluminum (Al), gold (Au), silver (Ag), copper (Cu), tin (Sn), other suitable metal or a combination thereof. In some other embodiments, the electronic component 170 can directly contact the electrical connective part 160 or the electrical connective part 121.

In order to secure the electronic component 170 onto the side surface 110S and the side surface 120S, the gap between the electronic component 170 and the interposer substrate 110 and the gap between the electronic component 170 and the wiring substrate 120 can be filled with an underfill 181. In some embodiments, the underfill 181 can be formed by a liquid encapsulant material and a curing process after the liquid encapsulant material is dispensed. In some embodiments, the liquid encapsulant material includes epoxy and suitable additives within epoxy. With fluidity of the liquid encapsulant material, the gap between the electronic component 170 and the interposer substrate 110 and the gap between the electronic component 170 and the wiring substrate 120 can entirely be filled with the underfill 181. After the curing process, the underfill 181 can increase the adhesive strength of the electronic component 170 onto the side surface 110S and the side surface 120S, thereby decrease a risk of detachment of the electronic component 170. Consequently, the reliability of the electronic circuit assembly 100 can be enhanced.

Continuing referring to FIG. 1G, FIG. 1G illustrates an operation of mounting an electronic component 172 on the first surface S1 of the interposer substrate 110. In some embodiments where the build-up layer structure 140 is implemented, the electronic component 172 can be mounted on the build-up layer structure 140. Subsequently, FIG. 1G illustrates an operation of electrically connecting the electronic component 172 and the electronic component 170. The electronic component 172 can be electrically connected to the electronic component 170 through the electrical connective part 160. The electronic component 172 can be electrically connected to the electronic component 170 through the electrical connective part 121. With arrangement of the electrical connective part 160 disposed on the side surface 110S, the communication distance between the electronic component 172 and the electronic component 170 can be reduced, thereby decreasing a risk of signal loss.

The electronic component 172 can be a passive component, for example a capacitor, an inductor, a resistor and the like. Alternatively, the electronic component 172 can be an active component, for example a transistor. Alternatively, the electronic component 170 can include a passive component and an active component, such as an integrated circuit (IC) with the passive component and the active component, but the present disclosure is not limited thereto.

In some embodiments, a metal layer 182 can be disposed between the electronic component 172 and the pad 142 of the build-up layer structure 140. The metal layer 182 can provide the function of solder to bond the electronic component 172 to the pad 142 of the build-up layer structure 140. In some embodiments, the material of the metal layer 182 can include aluminum (Al), gold (Au), silver (Ag), copper (Cu), tin (Sn), other suitable metal or a combination thereof. In some other embodiments, the electronic component 172 can directly contact the pad 142 of the build-up layer structure 140.

The gap between the electronic component 172 and the build-up layer structure 140 can be filled with an underfill 183. In some embodiments, the underfill 183 can be formed by a liquid encapsulant material and a curing process after the liquid encapsulant material is dispensed. In some embodiments, the liquid encapsulant material includes epoxy and suitable additives within epoxy. With fluidity of the liquid encapsulant material, the gap between the electronic component 172 and the build-up layer structure 140 can entirely be filled with the underfill 183. As a result, the reliability of the electronic circuit assembly 100 can be enhanced.

Figure 2:
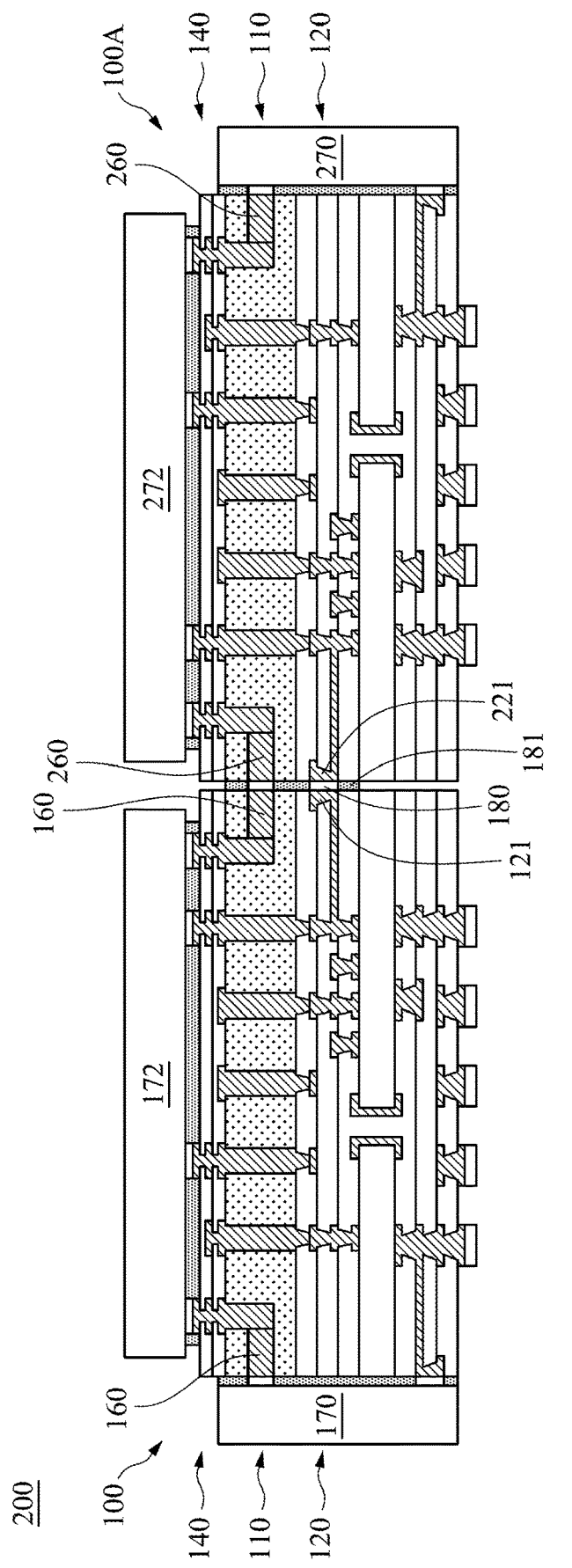
FIG. 2 is a cross-sectional view of an electronic circuit assembly according to some embodiments of the present disclosure.

Referring to FIG. 2, FIG. 2 is a cross-sectional view of an electronic circuit assembly 200 according to some embodiments of the present disclosure. The electronic circuit assembly 200 shown in FIG. 2 is an exemplary embodiment describing that an electronic component used a side packaging can be a passive component, an active component, or another electronic circuit assembly. The electronic circuit assembly 200 is similar to the electronic circuit assembly 100, and the difference is that one of the electronic components 170 is replaced with another electronic circuit assembly 100A. In other words, the electronic circuit assembly 100 and the electronic circuit assembly 100A may collectively form the electronic circuit assembly 200 with a larger dimension. The electrical connective part 121 of the electronic circuit assembly 100 can be connected to the electrical connective part 221 of the electronic circuit assembly 100A. The electrical connective part 160 of electronic circuit assembly 100 can be connected to an electrical connective part 260 of electronic circuit assembly 100A.

Hence, in some embodiments, the electronic component 172 of electronic circuit assembly 100 can be electrically connected to an electronic component 272 of the electronic circuit assembly 100A through the electrical connective part 160 and the electrical connective part 260. Similarly, an electronic component 270 can be mounted to a side of the electronic circuit assembly 100A. In FIG. 2, the structure of the electronic circuit assembly 100A is similar to that of the electronic circuit assembly 100, but the present disclosure is not limited thereto.

Figure 3:
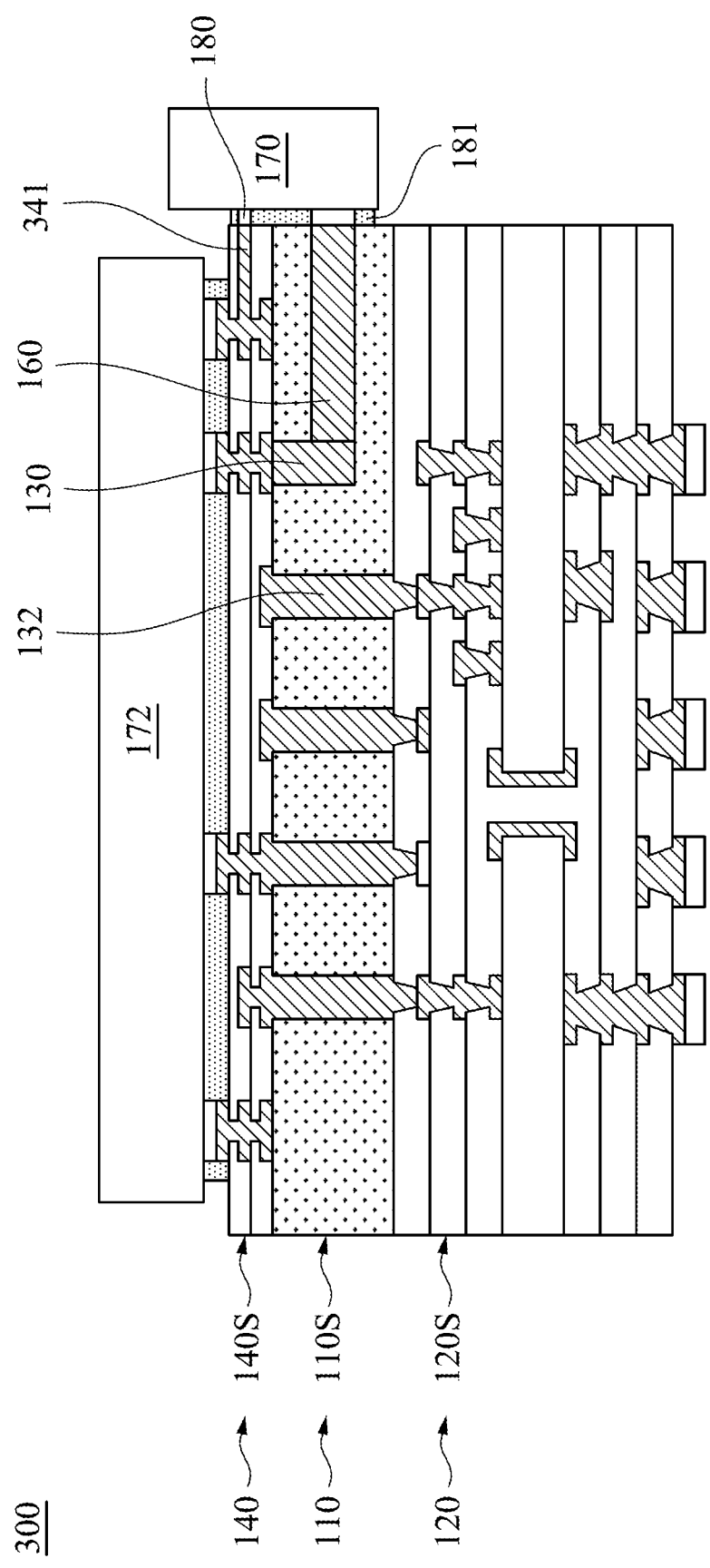
FIG. 3 is a cross-sectional view of an electronic circuit assembly according to some embodiments of the present disclosure.

Referring to FIG. 3, FIG. 3 is a cross-sectional view of an electronic circuit assembly 300 according to some embodiments of the present disclosure. The electronic circuit assembly 300 shown in FIG. 3 is an exemplary embodiment describing that an electrical connective part used a side packaging can be disposed in the build-up layer structure 140. The electronic circuit assembly 300 is similar to the electronic circuit assembly 100 (referring to FIG. 1G), and the difference is that the electrical connective part 121 disposed in the wiring substrate 120 (referring to FIG. 1G) can be replaced with an electrical connective part 341 disposed in the build-up layer structure 14. Particularly, the electrical connective part 341 can be disposed in the build-up layer structure 140 and extend to the side surface 140S of the build-up layer structure 140.

The electronic component 170 can be mounted on the side surface 140S of the build-up layer structure 140 and electrically connected to the electrical connective part 341. It is noted that the electronic component 170 can still be mounted on the side surface 110S of the interposer substrate 110 and electrically connected to the electrical connective part 160. As a result, the electronic component 170 can be connected to the electrical connective part 160 and the electrical connective part 341 at the same time. Similarly, since the material of the interposer substrate 110 is chosen to have a lower CTE, the electronic component 170 can firmly be mounted on the interposer substrate 110, thereby enhancing the reliability of side packaging.

Figure 4A:
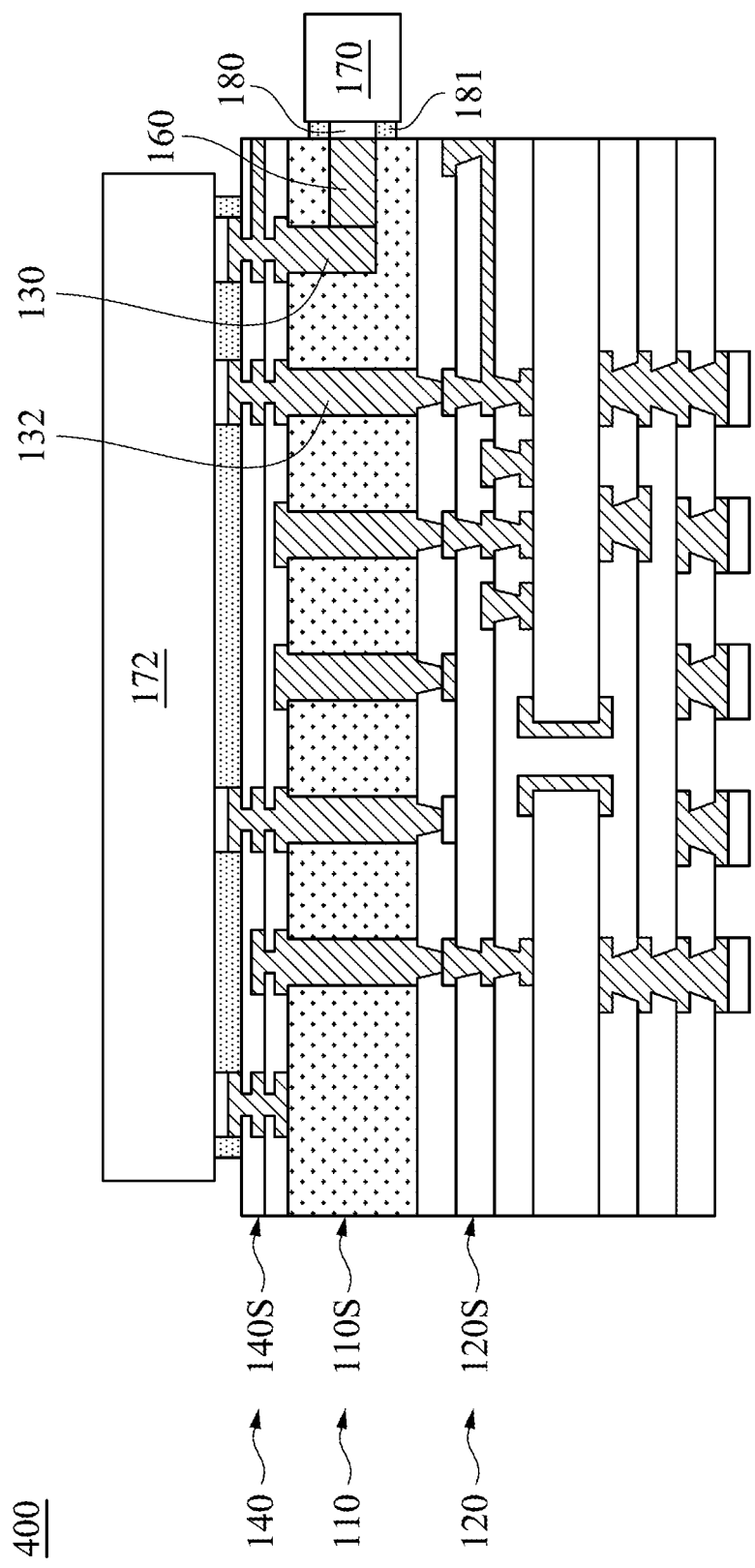
FIG. 4A is a cross-sectional view of an electronic circuit assembly according to some embodiments of the present disclosure.
Figure 4B:
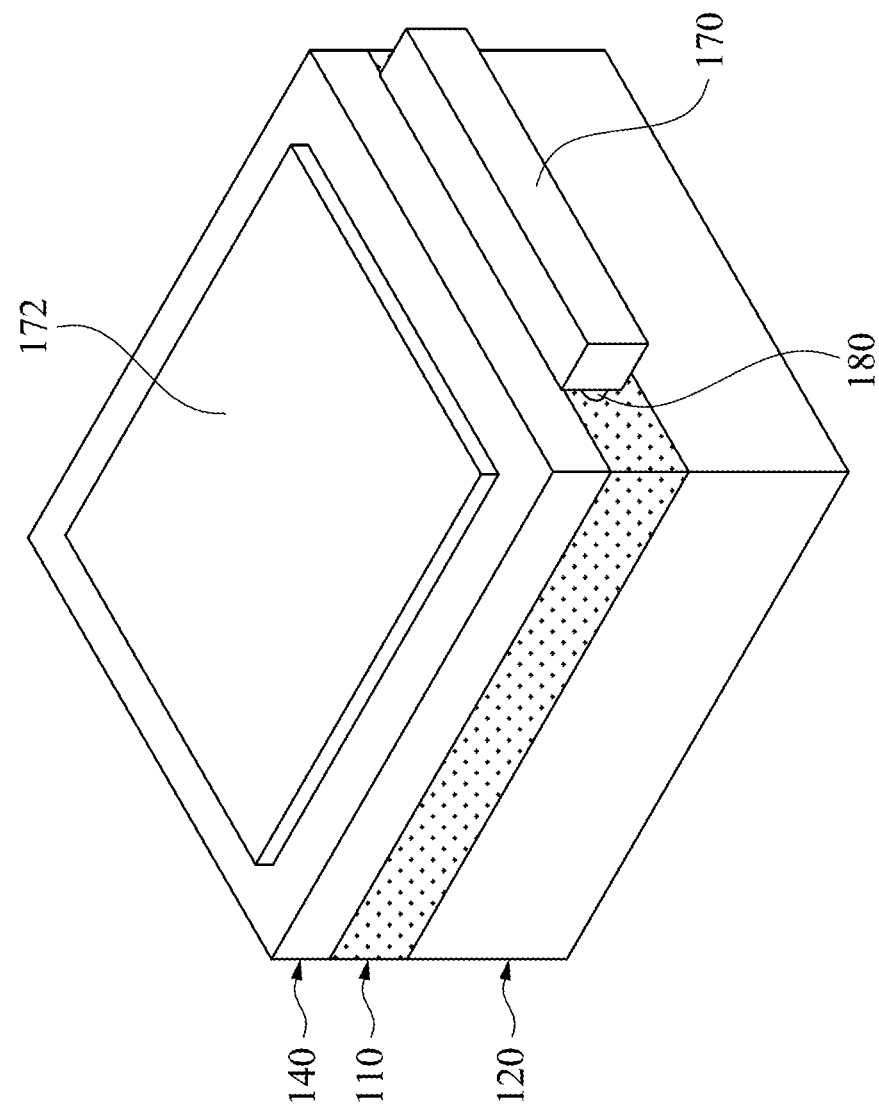
FIG. 4B is a schematic perspective view of the electronic circuit assembly shown in FIG. 4A according to some embodiments of the present disclosure.

Referring to FIG. 4A and FIG. 4B, FIG. 4A is a cross-sectional view of an electronic circuit assembly 400 assembly according to some embodiments of the present disclosure, and FIG. 4B is a schematic perspective view of the electronic circuit assembly 400 shown in FIG. 4A according to some embodiments of the present disclosure. The electronic circuit assembly 400 shown in FIG. 4A and FIG. 4B is an exemplary embodiment describing that all electrical connective parts used in a side packaging can be disposed in the interposer substrate 110. In other words, the electronic circuit assembly 400 may include at least two electrical connective parts 160 disposed in the interposer substrate 110. The electronic component 170 can be mounted on the side surface 110S of the interposer substrate 110 and electrically connected to the electrical connective parts 160. It is noted that, for the purpose of clarity, FIG. 4B is simplified and only part of elements/units are presented. Therefore, the elements/units shown in FIG. 4A (cross-sectional view) is not necessary to completely correspond to the elements/units shown in FIG. 4B (schematic perspective view).

Similarly, since the material of the interposer substrate 110 is chosen to have a lower CTE, the electronic component 170 can firmly be mounted on the interposer substrate 110, thereby enhancing the reliability of side packaging. Particularly, in such embodiments, when the electronic component 170 is only mounted on the side surface 110S of the interposer substrate 110, a risk of detachment of the electronic component 170 may be decreased, thereby enhancing the reliability of the side packaging.

Figure 5A:
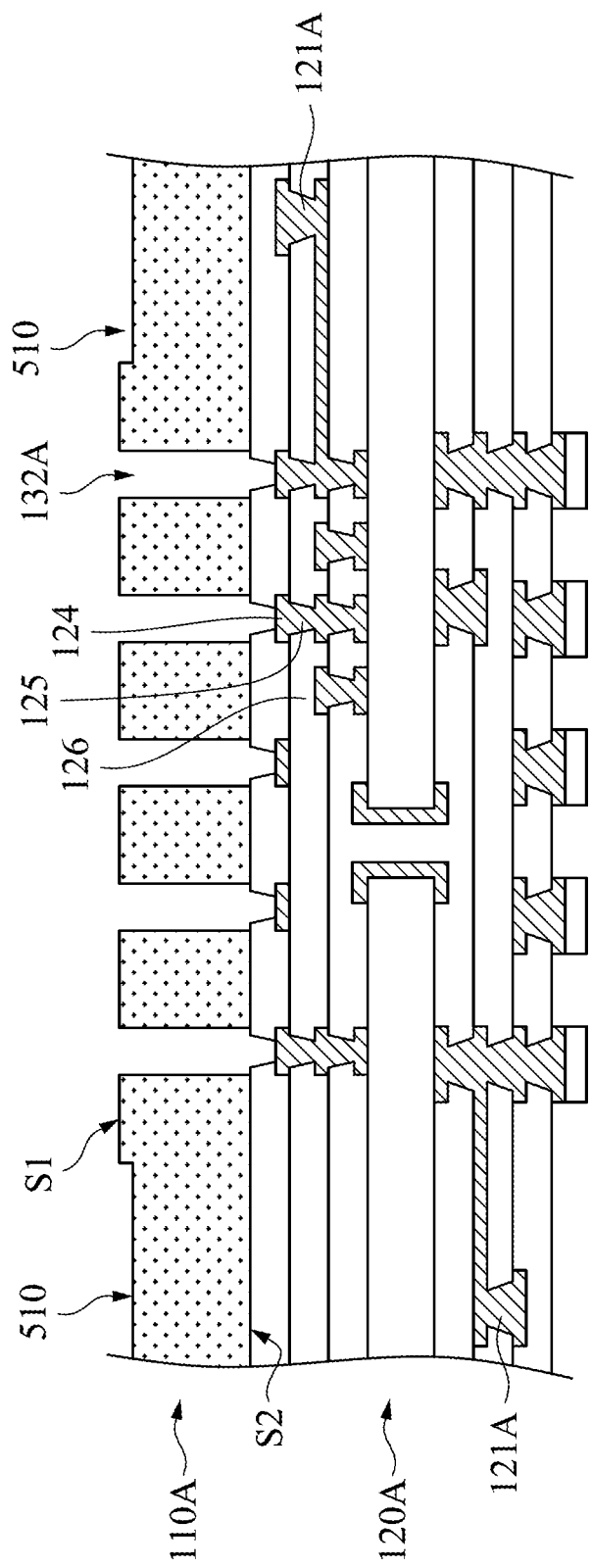

FIG. 5A-FIG. 5H are cross-sectional views at various intermediate stages of manufacturing an electronic circuit assembly 500 according to some embodiments of the present disclosure. FIG. 5F, FIG. 5G and FIG. 5H are enlargement views of the electronic circuit assembly 500 shown in FIG. 5E according to some embodiments of the present disclosure. Unless otherwise illustrated, the order in which some or all of the operations are described should not be construed to imply that these operations are necessarily order dependent. Alternative ordering will be appreciated having the benefit of this description. Additional operations can be provided before, during, and/or after these operations to completely form the electronic circuit assembly 500, and may be briefly described herein. Further, it will be understood that not all operations are necessarily present in each embodiment provided herein. Also, it will be understood that not all operations are necessary in some embodiments.

Figure 5B:
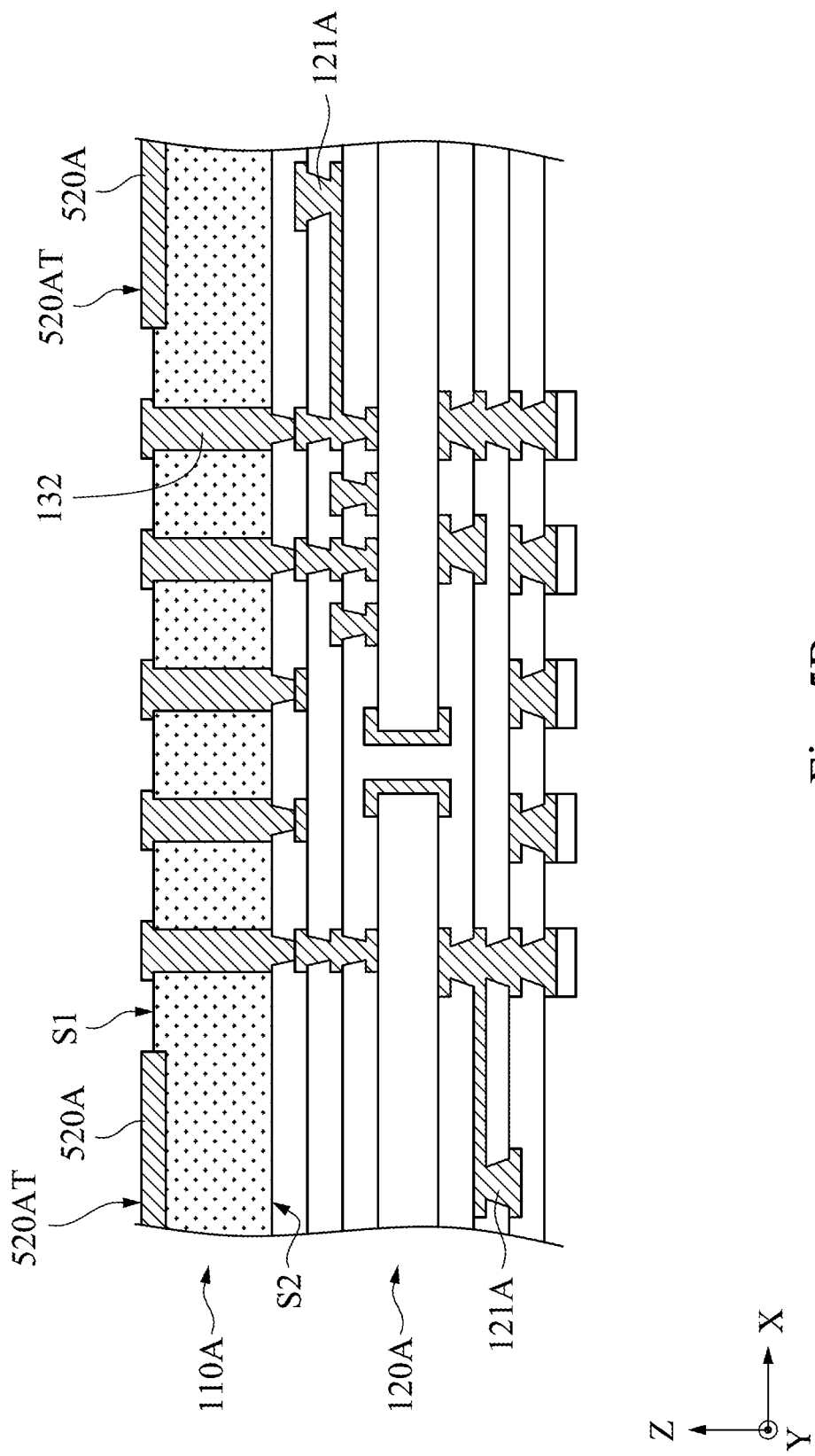

Referring to FIG. 5A, an operation illustrated in FIG. 5A can be continued from the operation illustrated in FIG. 1A. FIG. 5B illustrates the operation of, after bonding the interposer substrate 110A and the wiring substrate 120A, forming a trench 510 and the through hole 132A in the interposer substrate 110A. The trench 510 is a recess from the first surface S1 to the second surface S2, and the bottom of the trench 510 can be positioned anywhere in the interposer substrate 110A depending on process conditions and product requirements. Further, the trench 510 may laterally extend (e.g., parallel to XY plane) in the first surface S1.

Referring to FIG. 5B, FIG. 5B illustrates an operation of forming a wire 520A and the conductive blind hole 132 in the interposer substrate 110A. Particularly, the wire 520A can be partially embedded in the interposer substrate 110A. For example, an upper surface 520AT of the wire 520A may be higher than the first surface S1. Alternatively, the upper surface 520AT of the wire 520A may be coplanar with the first surface S1. In other words, the interposer substrate 110A may wrap one part of surfaces of the wire 520A, and the other part of surfaces of the wire 520A without coverage of the interposer substrate 110A may be exposed in the first surface S1. In addition, a method for forming the wire 520A and the conductive blind hole 132 in the interposer substrate 110A can include performing a deposition process (e.g., an electroplating process) to fill the trench 510 and the through hole 132A (referring to FIG. 5A) with a conductive material.

Figure 5C:
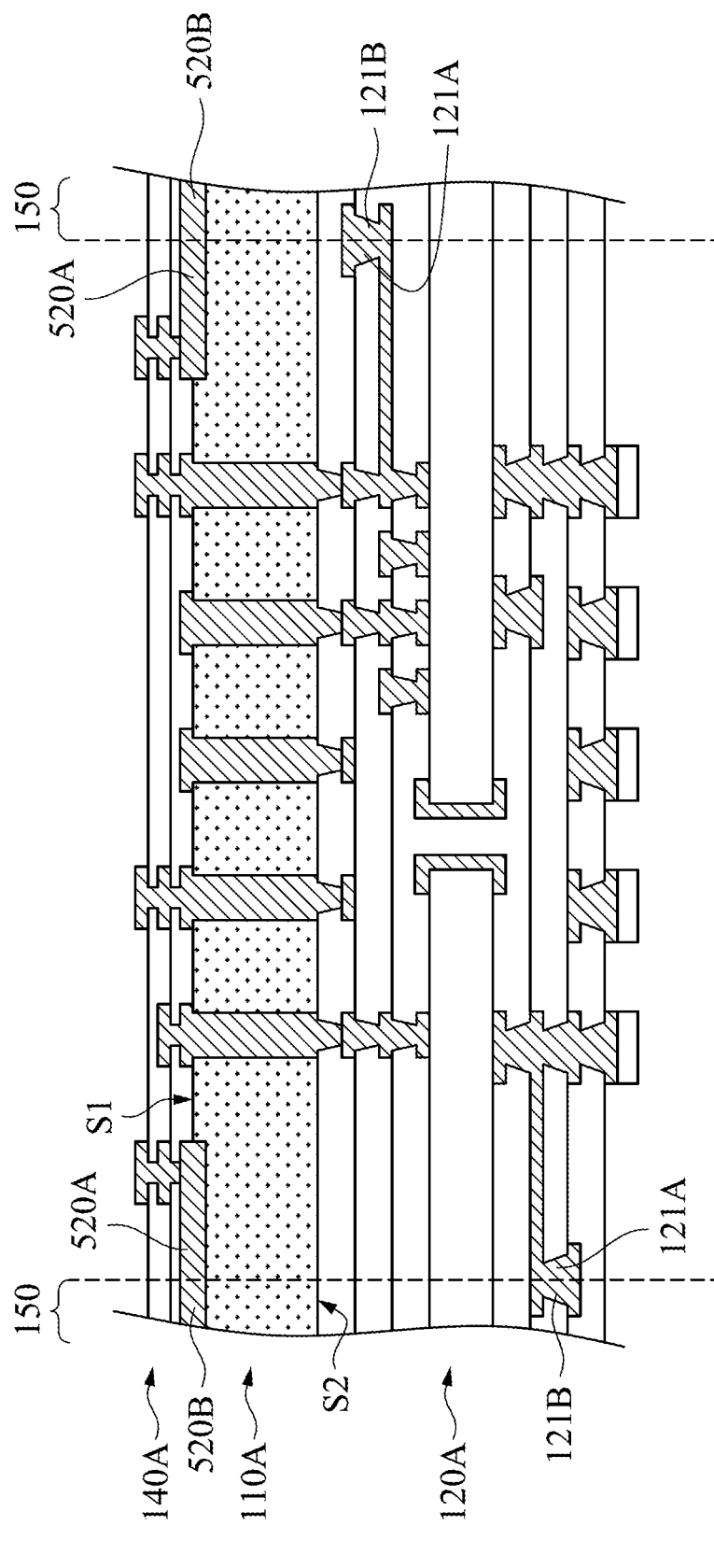

Referring to FIG. 5C, FIG. 5C illustrates an operation of the build-up layer structure 140A on the first surface S1 of the interposer substrate 110A. The number of layers in the build-up layer structure 140A can be adjusted according to process conditions and product requirements. Since the wire 520A is partially embedded in the interposer substrate 110A, the build-up layer structure 140A can directly contact the wire 520A.

In some embodiment as shown in FIG. 5C, a portion of the interposer substrate 110A, a portion of the wiring substrate 120A and a portion of the build-up layer structure 140A are positioned within a saw area 150. In some embodiments, a portion 520B of the wire 520A in the interposer substrate 110A can be positioned within the saw area 150. In some embodiments, the portion 121B of the conductive blind hole 121A in the wiring substrate 120A can be positioned within the saw area 150.

Figure 5D:
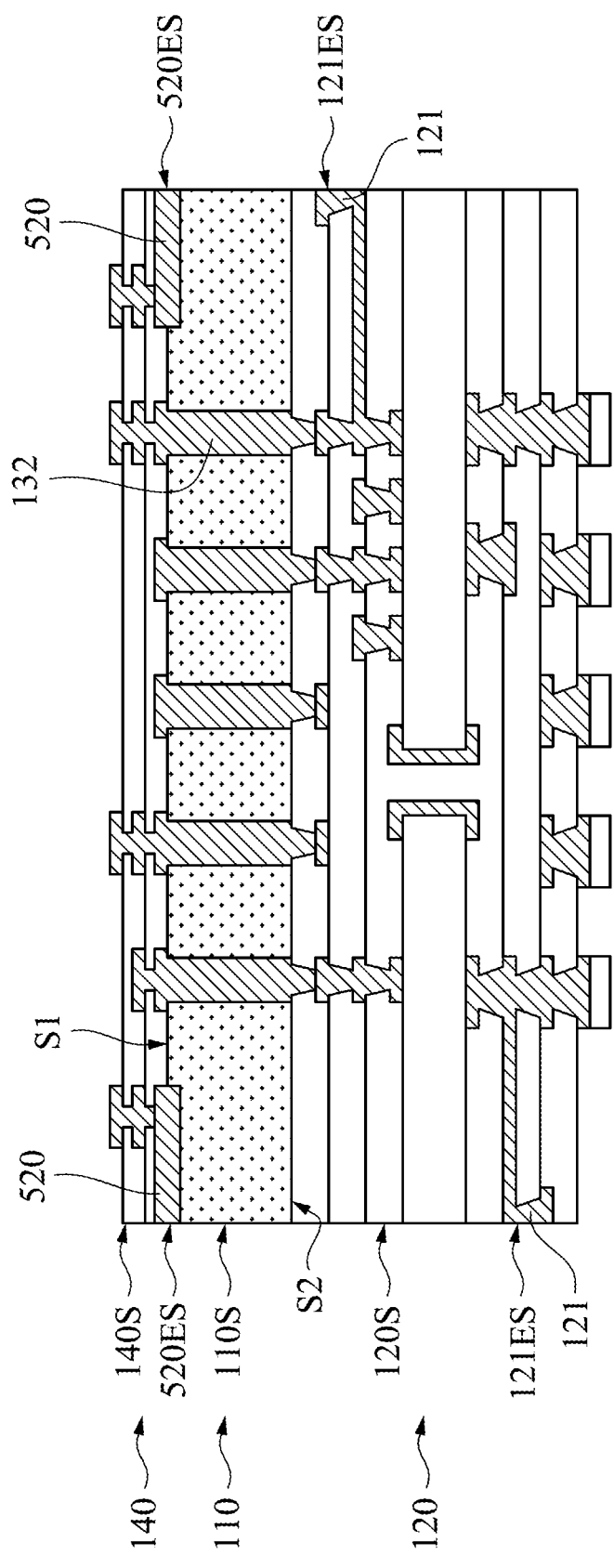

Referring to FIG. 5D, FIG. 5D illustrates an operation of cutting (e.g., dicing) the interposer substrate 110A and the wiring substrate 120A along the saw area 150 such that the interposer substrate 110A and the wiring substrate 120A respectively form one interposer substrate 110 and one wiring substrate 120. In an embodiment where the build-up layer structure 140A is disposed on the interposer substrate 110A, the build-up layer structure 140A is cut to form one build-up layer structure 140.

After cutting (e.g., dicing), the interposer substrate 110 can still have the first surface S1, the second surface S2 opposite to the first surface S1, and the side surface 110S connected to the first surface S1 and the second surface S2. The wiring substrate 120 can have the side surface 120S. In some embodiments, the side surface 120S can be flush with the side surface 110S. In some other embodiments, the build-up layer structure 140 can have the side surface 140S which is flush with the side surface 110S.

During a process of cutting, the portion 520B (referring to FIG. 5C) of the wire 520A positioned within the saw area 150 may be removed, and therefore an electrical connective part 520 can be formed. After cutting (e.g., dicing), the cut wire 520A (i.e., the electrical connective part 520) may have an end surface 520ES exposed in the side surface 110S. In some embodiments, with the end surface 520ES exposed in the side surface 110S, the electrical connective part 520 can be connected to an electronic component (not shown herein) in the later manufacturing stage.

After cutting (e.g., dicing), the electrical connective part 520 can be formed in the interposer substrate 110 and extend to the side surface 110S of the interposer substrate 110 with the end surface 520ES exposed in the side surface 110S. Similarly, during cutting (e.g., dicing), the portion 121B (referring to FIG. 5C) of the conductive blind hole 121A positioned within the saw area 150 may be removed, and therefore the electrical connective part 121 can be formed. The electrical connective part 121 has been discussed previously and no further descriptions is elaborated herein.

The interposer substrate 110 and the build-up layer structure 140 can collectively wrap the electrical connective part 520 without covering the end surface 520ES. In other words, expect for the end surface 520ES, the rest of the electrical connective part 520 may be embedded in the interposer substrate 110 and the build-up layer structure 140.

In some embodiments, the end surface 520ES is exposed in the side surface 110S and flush with the side surface 110S. In some other embodiments, the end surface 520ES is exposed in the side surface 110S and is not flush with the side surface 110S. For instance, the end surface 520ES can protrude from the side surface 110S. In some embodiments, after cutting, a dry etching process or a wet etching process may be performed on the side surface 110S to make the end surface 520ES protrude from the side surface 110S. For example, fluorine-containing gas, such as Sulfur(IV) fluoride (SF4), carbon tetrafluoride (CF4) and any other suitable gas mixing therewith, can be applied in the dry etching process to etch a portion of the interposer substrate 110. An etchant solution applied in the wet etching process can include any suitable chemicals which are capable of removing desmear. In some embodiments, a fluorine-containing solution such as hydrofluoric acid can be used in the wet etching process.

Referring to FIG. 5E, FIG. 5E illustrates an operation of mounting the electronic component 170 on the side surface 110S of the interposer substrate 110 and the side surface 120S of the wiring substrate 120, electrically connecting the electronic component 170 and the electrical connective part 520, and electrically connecting the electronic component 170 and the electrical connective part 121. Then, the electronic circuit assembly 500 including the electronic component 170, the interposer substrate 110 and the wiring substrate 120 can substantially be complete.

Referring to FIG. 5F, FIG. 5F is an enlargement view of the region indicated with a broken line in the electronic circuit assembly 500 shown in FIG. 5E according to some embodiments of the present disclosure. In some embodiments where the upper surface 520T of the electrical connective part is higher than the first surface S1, the electrical connective part 520 can include a first portion 522 embedded in the interposer substrate 110 and a second portion 524 embedded in the build-up layer structure 140. In other words, the electrical connective part 520 can be sandwiched between the interposer substrate 110 and the build-up layer structure 140.

Referring to FIG. 5G, FIG. 5G is an enlargement view of the region indicated with a broken line in the electronic circuit assembly 500 shown in FIG. 5E according to some other embodiments of the present disclosure. In some embodiments where the upper surface 520T of the electrical connective part is coplanar with the first surface S1, the build-up layer structure 140 can only contact the upper surface 520T of the electrical connective part 520. In other words, the electrical connective part 520 is disposed in the interposer substrate 110.

Referring to FIG. 5H, FIG. 5H is an enlargement view of the region indicated with a broken line in the electronic circuit assembly 500 shown in FIG. 5E according to some other embodiments of the present disclosure. In some embodiments where the upper surface 520T of the electrical connective part is below the first surface S1, the build-up layer structure 140 can only contact the upper surface 520T of the electrical connective part 520. In other words, the electrical connective part 520 is disposed in the interposer substrate 110.

Referring back to FIG. 5E, as discussed previously in FIG. 1G, the material of the interposer substrate 110 is chosen to be the material with a low CTE, for example in range between 1 ppm/° C. and 5 ppm/° C. When the electronic component 170 is mounted on the side surface 110S of the interposer substrate 110, since the interposer substrate 110 with low CTE may not deform with temperature too much to cause detachment of the electronic component 170, the electronic component 170 can be firmly mounted on the interposer substrate 110, thereby enhancing the reliability of side packaging.

In addition, the electronic component 170 can be mounted on the side surface 110S of the interposer substrate 110, the side surface 120S of the wiring substrate 120 or the side surface 140S of the build-up layer structure 140 to effectively utilize a side space (e.g., parallel to parallel to YZ plane or XZ plane). Therefore, the footprint of wiring (e.g., parallel to XY plane) can be reduced, thereby scaling down the dimension of the electronic circuit assembly 100.

In some embodiments, the metal layer 180 can be disposed between the electronic component 170 and the electrical connective part 520, or between the electronic component 170 and electrical connective part 121, as shown in FIG. 5E. The metal layer 180 can provide the function of solder to bond the electronic component 170 to the side surface 110S, the side surface 120S or the side surface 140S. In some other embodiments, the electronic component 170 can directly contact the electrical connective part 520 or the electrical connective part 121.

The gap between the electronic component 170 and the interposer substrate 110 and the gap between the electronic component 170 and the wiring substrate 120 can be filled with the underfill 181 to increase the adhesive strength of the electronic component 170 onto the side surface 110S and the side surface 120S. Therefore, a risk of detachment of the electronic component 170 can be decreased, and the reliability of the electronic circuit assembly 100 can be enhanced.

Continuing referring to FIG. 5E, FIG. 5E illustrates an operation of mounting the electronic component 172 on the first surface S1 of the interposer substrate 110. In some embodiments where the build-up layer structure 140 is implemented, the electronic component 172 can be mounted on the build-up layer structure 140. Subsequently, FIG. 5E illustrates an operation of electrically connecting the electronic component 172 and the electronic component 170. The electronic component 172 can be electrically connected to the electronic component 170 through the electrical connective part 520. The electronic component 172 can be electrically connected to the electronic component 170 through the electrical connective part 121. With arrangement of the electrical connective part 520 disposed on the side surface 110S, the communication distance between the electronic component 172 and the electronic component 170 can be reduced, thereby decreasing a risk of signal loss. Similarly, in some embodiments, the metal layer 182 can be disposed between the electronic component 172 and the pad 142 of the build-up layer structure 140. In some other embodiments, the electronic component 172 can directly contact the pad 142 of the build-up layer structure 140. The gap between the electronic component 172 and the build-up layer structure 140 can be filled with the underfill 183 to secure the electronic component 172. As a result, the reliability of the electronic circuit assembly 500 can be enhanced.

Figure 6:
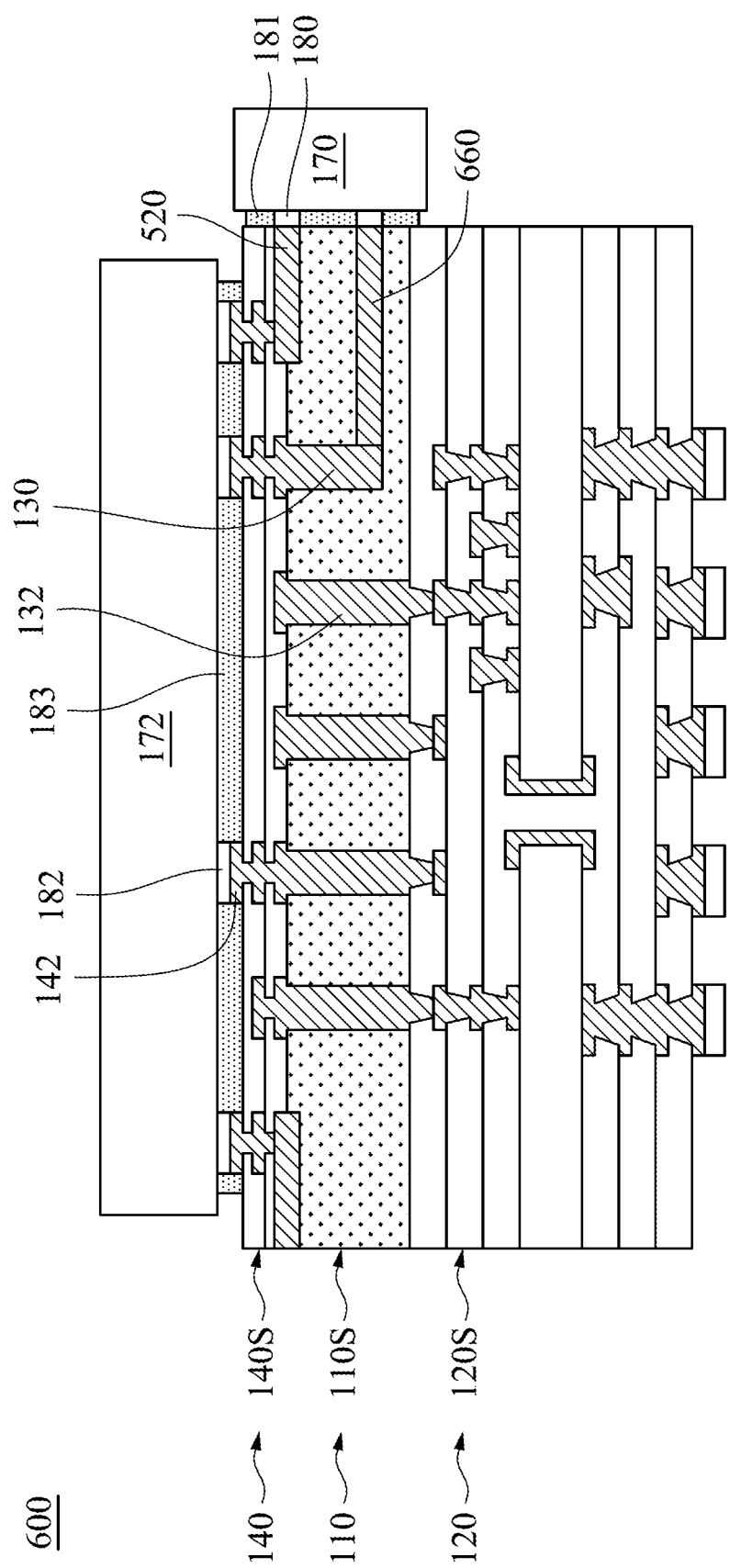
FIG. 6 is a cross-sectional view of an electronic circuit assembly according to some embodiments of the present disclosure.

Referring to FIG. 6, FIG. 6 is a cross-sectional view of an electronic circuit assembly 600 according to some embodiments of the present disclosure. The electronic circuit assembly 600 is similar to the electronic circuit assembly 500 (referring to FIG. 5E), and the difference is that the electrical connective part 121 in the wiring substrate 120 is replaced with an electrical connective part 660 formed in the interposer substrate 110. Particularly, the electrical connective part 660 can be disposed in the interposer substrate 110 can extend to the side surface 110S of the interposer substrate 110. The electrical connective part 660 is similar to the electrical connective part 160 (referring to FIG. 1G), and thus the method for forming the electrical connective part 160 can be adopted to form the electrical connective part 660.

Since the electrical connective part 520 and the electrical connective part 660 are all disposed in the interposer substrate 110, the electronic component 170 can be mounted on the side surface 110S of the interposer substrate 110 and electrically connected to the electrical connective part 520 and electrical connective part 660. Due to the fact that the material of the interposer substrate 110 is chosen to have a lower CTE, the electronic component 170 can firmly be mounted on the interposer substrate 110, thereby enhancing the reliability of side packaging. Particularly, in such embodiments where the electronic component 170 is only mounted on the side surface 110S of the interposer substrate 110, the reliability of the side packaging can be largely enhanced.

Figure 7A:
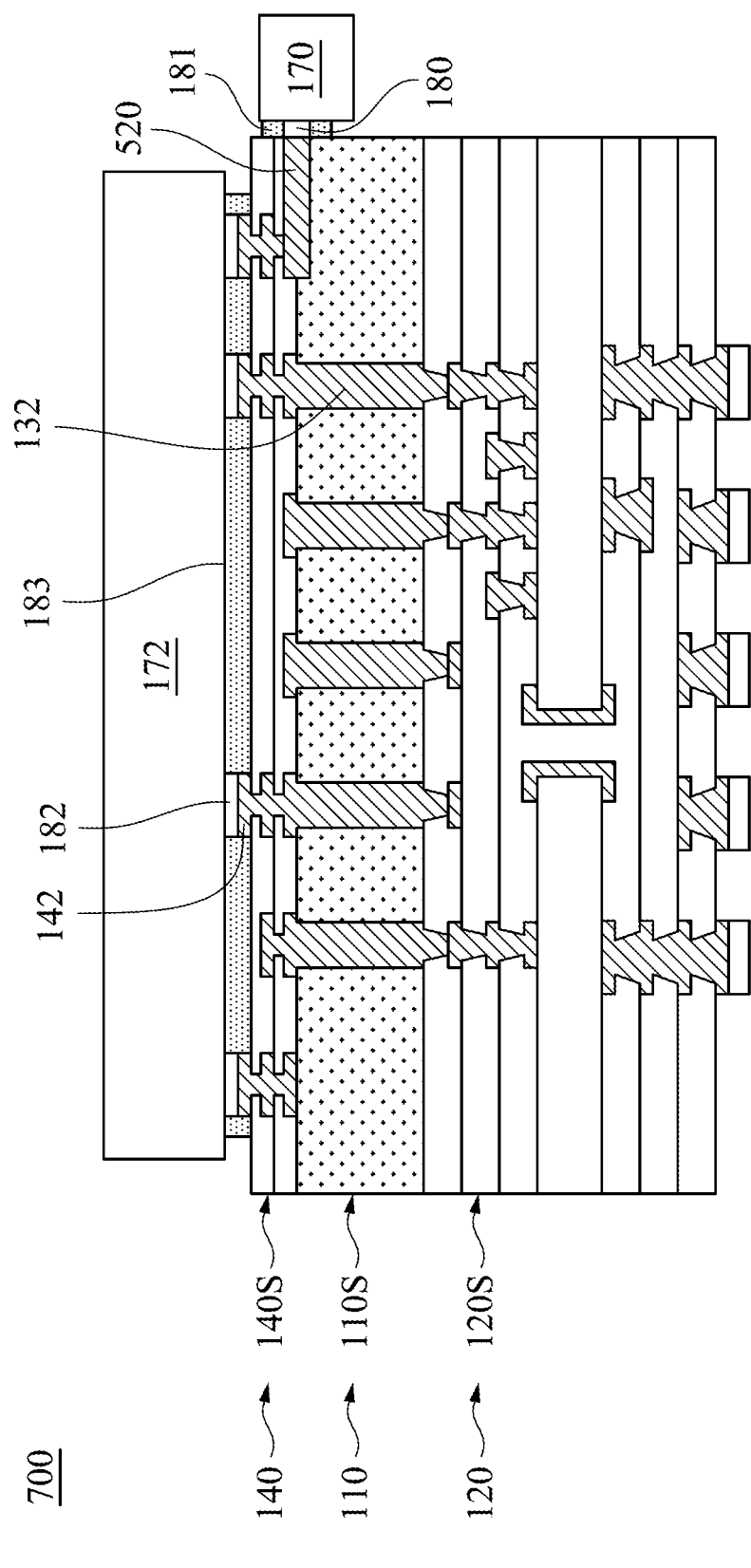
FIG. 7A is a cross-sectional view of an electronic circuit assembly according to some embodiments of the present disclosure.
Figure 7B:
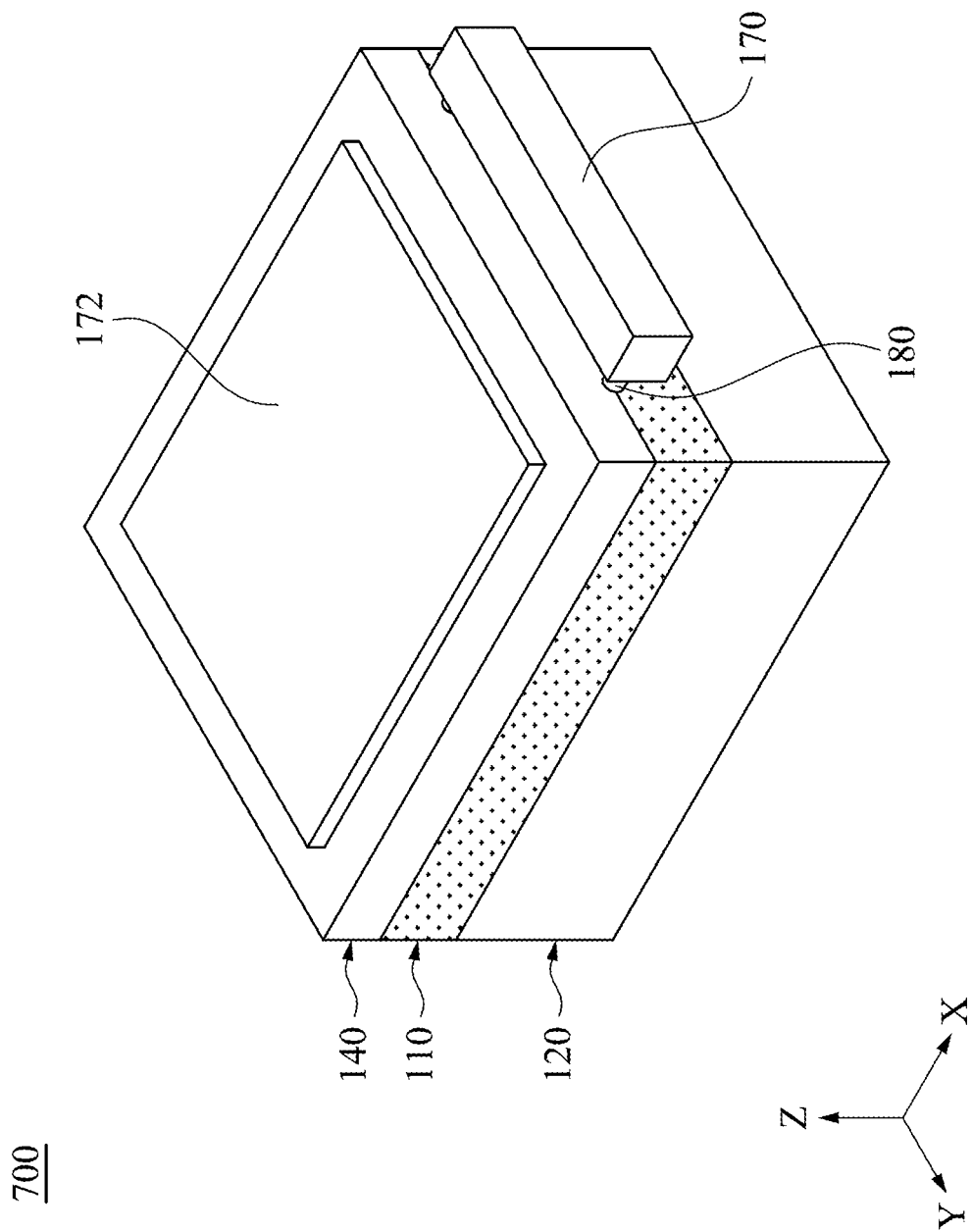
FIG. 7B is a schematic perspective view of the electronic circuit assembly shown in FIG. 7A according to some embodiments of the present disclosure.

Referring to FIG. 7A and FIG. 7B, FIG. 7A is a cross-sectional view of an electronic circuit assembly 700 assembly according to some embodiments of the present disclosure, and FIG. 7B is a schematic perspective view of the electronic circuit assembly 700 shown in FIG. 7A according to some embodiments of the present disclosure. The electronic circuit assembly 700 shown in FIG. 7A and FIG. 7B is an exemplary embodiment describing that all electrical connective parts used in a side packaging can be disposed in the interposer substrate 110 and touch the build-up layer structure 140. In other words, the electronic circuit assembly 700 may include at least two electrical connective parts 520 disposed in the interposer substrate 110 and touching the build-up layer structure 140. The electronic component 170 can be mounted on the side surface 110S of the interposer substrate 110 and electrically connected to the electrical connective parts 520. It is noted that, for the purpose of clarity, FIG. 7B is simplified and only part of elements/units are presented. Therefore, the elements/units shown in FIG. 7A (cross-sectional view) is not necessary to completely correspond to the elements/units shown in FIG. 7B (schematic perspective view).

Similarly, since the material of the interposer substrate 110 is chosen to have a lower CTE, the electronic component 170 can firmly be mounted on the interposer substrate 110, thereby enhancing the reliability of side packaging. Particularly, in such embodiments, when the electronic component 170 is only mounted on the side surface 110S of the interposer substrate 110, the reliability of the side packaging can be largely enhanced.

Figure 8:
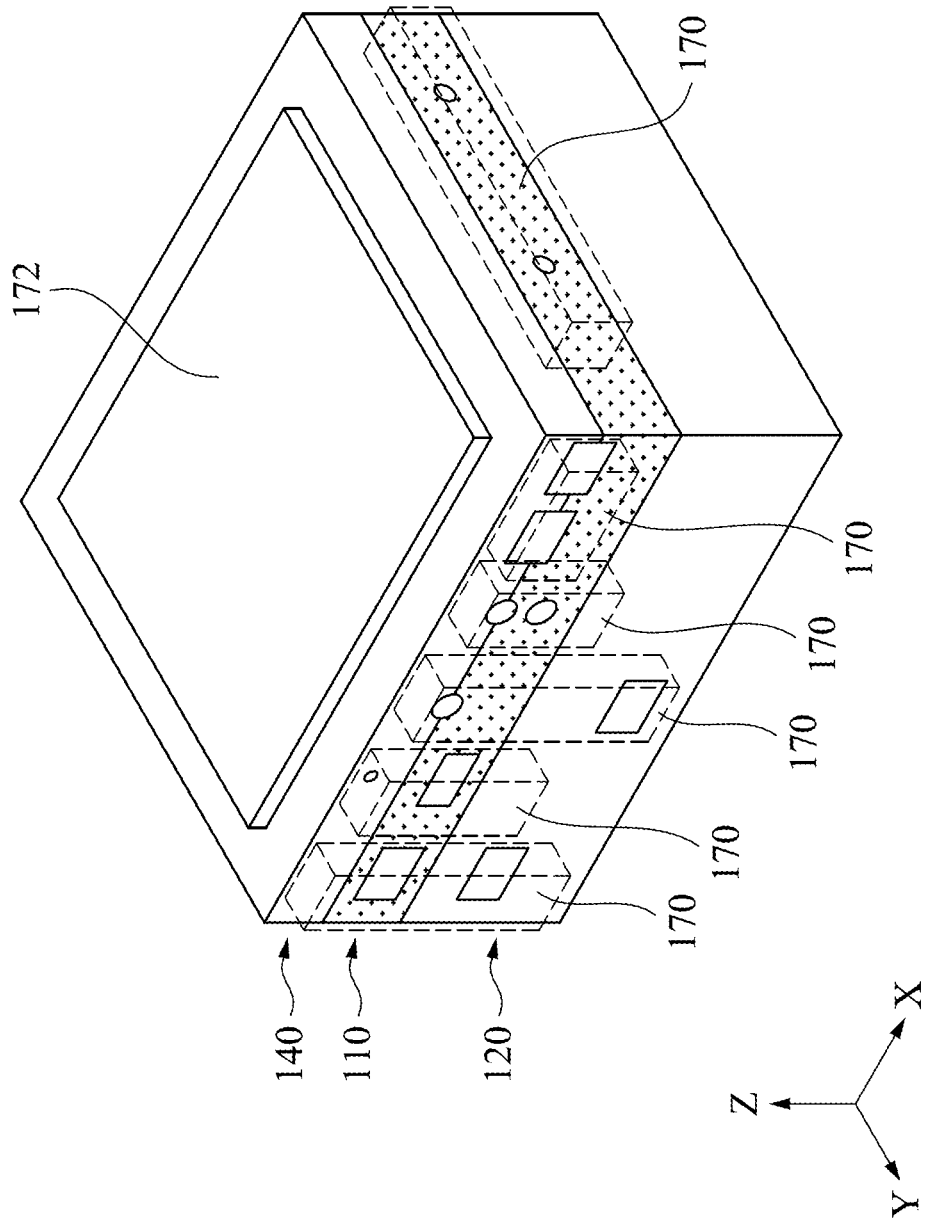
FIG. 8 is a schematic perspective view of an electronic circuit assembly according to some embodiments of the present disclosure.

Referring to FIG. 8, FIG. 8 is a schematic perspective view of an electronic circuit assembly 800 according to some embodiments of the present disclosure. For the purpose of clarity, FIG. 8 is simplified and only some elements/units are presented. The electronic circuit assembly 800 shown in FIG. 8 is an exemplary embodiment describing that electrical connective parts used in a side packaging can be adjusted according to process conditions and product requirements. For example, the number of the electrical connective part, the shape or dimension of an end surface, the arrangement and the like can be adjusted. The electronic component 170 in the electronic circuit assembly 800 may be connected to at least one electrical connective part disposed in the interposer substrate 110, for example the electrical connective part 160 or electrical connective part 660 as discussed previously. Due to the fact that the material of the interposer substrate 110 is chosen to have a lower CTE, a risk of detachment of the electronic component 170 from the interposer substrate 110 can be decreased, thereby enhancing the reliability of the side packaging.

The present disclosure discloses various embodiments to provide that an electrical connective part with an end surface exposed in a side surface of an electronic circuit assembly can be electrically connected to an electronic component, such that the side packaging can be implemented. Thus, the communication distance among the electronic components and the footprint of wiring can be reduced, facilitating the development of electronic products such as mobile phone, tablet, and notebook. Moreover, due to the fact that a substrate with low CTE may not deform with temperature too much to degrade the reliability, the substrate with low CTE can be used in the electronic circuit assembly, and an electronic component can be mounted onto a side surface of the substrate with low CTE, thereby enhancing the reliability of the side packaging.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic circuit assembly, comprising:
    an interposer substrate with a first coefficient of thermal expansion (CTE) comprising a first surface, a second surface opposite to the first surface, and a first side surface connected to the first surface and the second surface;
    a wiring substrate with a second CTE disposed below the second surface, wherein the first CTE is lower than the second CTE;
    a first electrical connective part disposed in the interposer substrate and extending to the first side surface, wherein the first electrical connective part comprises a first end surface in and is flush with the first side surface; and
    a first electronic component attached to the first side surface and electrically connected to the first electrical connective part.

2. The electronic circuit assembly of claim 1, wherein a ratio of the first CTE to the second CTE is in a range between 0.025 and 0.050.

3. The electronic circuit assembly of claim 1, wherein the first CTE is in a range between 1 ppm/° C. and 5 ppm/° C.

4. The electronic circuit assembly of claim 1, wherein the interposer substrate entirely wraps the first electrical connective part without covering the first end surface.

5. The electronic circuit assembly of claim 1, wherein the first electrical connective part is embedded in the interposer substrate, and an upper surface of the first electrical connective part is coplanar with the first surface.

6. The electronic circuit assembly of claim 1, wherein the first electrical connective part is embedded in the interposer substrate, and an upper surface of the first electrical connective part is below the first surface.

7. The electronic circuit assembly of claim 1, further comprising:
    a build-up layer structure disposed on the first surface, wherein the first electrical connective part comprises:
    a first portion embedded in the interposer substrate; and
    a second portion embedded in the build-up layer structure.

8. The electronic circuit assembly of claim 1, further comprising:
    a second electrical connective part disposed in the wiring substrate and extending to a second side surface of the wiring substrate, wherein the second side surface is flush with the first side surface, and the first electronic component is attached to the second side surface and electrically connected to the second electrical connective part.

9. The electronic circuit assembly of claim 1, further comprising:
    a second electrical connective part disposed in the interposer substrate and extending to the first side surface, wherein the first electronic component is electrically connected to the second electrical connective part.

10. The electronic circuit assembly of claim 1, further comprising:
    a build-up layer structure disposed on the first surface; and
    a second electrical connective part disposed in the build-up layer structure and extending to a second side surface of the build-up layer structure, wherein the first electronic component is attached to the second side surface and electrically connected to the second electrical connective part.

11. The electronic circuit assembly of claim 1, wherein the interposer substrate directly contacts the wiring substrate.

12. The electronic circuit assembly of claim 1, further comprising:
    a second electronic component attached to the first surface of the interposer substrate, wherein the first electronic component is electrically connected to the second electronic component through the first electrical connective part.

13. An electronic circuit assembly, comprising:
    an interposer substrate with a first coefficient of thermal expansion (CTE) comprising a first surface, a second surface opposite to the first surface, and a first side surface connected to the first surface and the second surface;
    a wiring substrate with a second CTE disposed below the second surface, wherein the first CTE is lower than the second CTE;
    a first electrical connective part disposed in the interposer substrate and extending to the first side surface;
    a first electronic component attached to the first side surface and electrically connected to the first electrical connective part; and
    a second electrical connective part disposed in the wiring substrate and extending to a second side surface of the wiring substrate, wherein the second side surface is flush with the first side surface, and the first electronic component is attached to the second side surface and electrically connected to the second electrical connective part.

14. The electronic circuit assembly of claim 13, wherein the interposer substrate directly contacts the wiring substrate.

15. The electronic circuit assembly of claim 13, wherein a ratio of the first CTE to the second CTE is in a range between 0.025 and 0.050.

16. The electronic circuit assembly of claim 13, wherein the first CTE is in a range between 1 ppm/° C. and 5 ppm/° C.

17. The electronic circuit assembly of claim 13, wherein the interposer substrate entirely wraps the first electrical connective part without covering the first end surface.

18. The electronic circuit assembly of claim 13, wherein the first electrical connective part is embedded in the interposer substrate, and an upper surface of the first electrical connective part is coplanar with the first surface.

19. The electronic circuit assembly of claim 13, wherein the first electrical connective part is embedded in the interposer substrate, and an upper surface of the first electrical connective part is below the first surface.

* * * * *